US010528426B2

(12) United States Patent
Dubeyko et al.

(10) Patent No.: US 10,528,426 B2
(45) Date of Patent: Jan. 7, 2020

(54) METHODS, SYSTEMS AND DEVICES FOR RECOVERING FROM CORRUPTIONS IN DATA PROCESSING UNITS IN NON-VOLATILE MEMORY DEVICES

(71) Applicant: Western Digital Technologies, Inc., San Jose, CA (US)

(72) Inventors: Viacheslav Anatolyevich Dubeyko, San Jose, CA (US); Luis Vitorio Cargnini, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 187 days.

(21) Appl. No.: 15/828,104

(22) Filed: Nov. 30, 2017

(65) Prior Publication Data

US 2019/0163562 A1    May 30, 2019

(51) Int. Cl.
    *G06F 11/14*     (2006.01)
    *G06F 11/10*     (2006.01)
    *G11C 7/10*     (2006.01)
    *G06F 15/78*     (2006.01)

(52) U.S. Cl.
CPC ...... *G06F 11/1435* (2013.01); *G06F 11/1004* (2013.01); *G06F 15/785* (2013.01); *G11C 7/1006* (2013.01)

(58) Field of Classification Search
CPC .......... G06F 11/1004; G06F 11/1008; G06F 11/1012; G06F 11/1016; G06F 11/1068; G06F 11/141; G06F 11/1435; G06F 3/0614; G06F 3/0617; G06F 3/0619; G06F 15/7839; G06F 15/7842; G06F 15/785; G11C 7/1006
See application file for complete search history.

(56) References Cited

U.S. PATENT DOCUMENTS

| 5,396,641 | A | * | 3/1995 | Iobst | G06F 7/509 700/2 |
| 8,924,661 | B1 | * | 12/2014 | Shachar | G06F 13/1668 365/189.2 |
| 2004/0083405 | A1 | * | 4/2004 | Chang | G06F 11/0763 714/24 |
| 2005/0076063 | A1 | * | 4/2005 | Andoh | G06F 11/1435 |

(Continued)

OTHER PUBLICATIONS

"Processor in Non-Volatile Memory (PiNVSM): Towards to Data-centric Computing in Decentralized Environment", Dubeyko, 2019. (Year: 2019).*

*Primary Examiner* — Gabriel Chu
(74) *Attorney, Agent, or Firm* — Chang & Hale LLP

(57) ABSTRACT

Systems and methods are disclosed for recovering from various types of data and process corruptions at a data processing unit of a plurality of data processing units each coupled with a non-volatile memory divided into a plurality of selectable locations, in a system absent a central processing unit. In some embodiments a data processing unit is configured to determine validity of an allocation table of the data processing unit, retrieve a process descriptor from the allocation table, parse the non-volatile memory for a first set of process data corresponding to the process descriptor, determine validity of the first set of process data corresponding to the process descriptor and attempt to recover the first set of process data in accordance with a determination that the first set of process data is invalid.

28 Claims, 26 Drawing Sheets

(56) References Cited

U.S. PATENT DOCUMENTS

2009/0106327 A1* 4/2009 Dilman ............... G06F 11/0727
2011/0060775 A1* 3/2011 Fitzgerald ........... G06F 11/1435
707/824

* cited by examiner

METHODS, SYSTEMS AND DEVICES FOR RECOVERING FROM CORRUPTIONS IN DATA PROCESSING UNITS IN NON-VOLATILE MEMORY DEVICES

RELATED APPLICATIONS

This application incorporates by reference U.S. application Ser. No. 15/661,431 filed Jul. 27, 2017, entitled METHODS, SYSTEMS AND DEVICES FOR RESTARTING DATA PROCESSING UNITS in its entirety. This application incorporates by reference U.S. application Ser. No. 15/395,474 filed Dec. 30, 2016, entitled PROCESSOR IN NON-VOLATILE STORAGE MEMORY in its entirety. This application also incorporates by reference U.S. application Ser. No. 15/395,415 filed Dec. 30, 2016, entitled PROCESSOR IN NON-VOLATILE STORAGE MEMORY in its entirety. This application also incorporates by reference U.S. application Ser. No. 15/828,350 filed on Nov. 30, 2017, entitled METHODS, SYSTEMS AND DEVICES FOR RECOVERING FROM CORRUPTIONS IN DATA PROCESSING UNITS in its entirety.

BACKGROUND

Field

The present disclosure generally relates to a novel computing architecture utilizing non-volatile memory. More specifically, the present disclosure relates to methods, systems and devices for storing, accessing and manipulating data in non-volatile memory arrays supported by distributed processing units allowing for in-place computations.

Description of Related Art

Modern computing techniques rely on a centralized approach to processing data using a central processing unit (CPU) and transferring data back and forth from storage. This transfer of data for tasks such as retrieving information, storing calculated results, and in some cases verifying the results, is a noticeable bottleneck in a centralized processing approach to computer architecture. Additionally, a centralized computer architecture utilizes random-access-memory (RAM) to perform processes of an operating system (OS). In this methodology a CPU retrieves data from a storage device, performs operations on the data in RAM and then returns results to the storage device for persistent storage. Nonetheless, existing storage devices such as disk drives (e.g., SMR HDD, PMR HDD, SSD) are relatively slow to read and write data, when compared to the capabilities of the memory cells themselves (e.g., speed of writing to DRAM). As computing systems evolve to provide implementation of data storage technology with faster read and write speeds (e.g., MRAM, ReRAM, NRAM, etc.), a centralized approach to computing will lead to data processing limitations.

SUMMARY

In accordance with some implementations, the present disclosure relates to a computing system comprising a device. The device comprises a non-volatile memory divided into a plurality of memory sub-arrays, each memory sub-array comprising a plurality of selectable locations. The system further comprises a plurality of data processing units communicatively coupled to the non-volatile memory in the absence of a central processing unit of the computing system and a data processing unit assigned to process data of a memory sub-array. In some embodiments the data processing unit of the plurality of data processing units is configured to determine validity of an allocation table of the data processing unit, retrieve a first process descriptor from the allocation table, parse the non-volatile memory for a first set of process data corresponding to the first process descriptor, determine validity of the first set of process data corresponding to the first process descriptor and attempt to recover the first set of process data in accordance with a determination that the first set of process data is invalid.

In some embodiments, validity of the allocation table is determined at least in part on a correspondence of contents of the allocation table to a checksum value assigned to the allocation table. In some embodiments, validity of the first set of process data is determined at least in part on a correspondence of contents of the first set of process data to a checksum value assigned to the first set of process data. In some embodiments, the data processing unit is further configured to retrieve the first process descriptor from the allocation table in accordance with a determination that the allocation table is valid.

In some embodiments, the first set of data comprises code data and user data. In some embodiments, the data processing unit is further configured to determine a failure to recover the first set of process data and remove the first process descriptor corresponding to the first set of process data from the allocation table, in accordance with a determination that the first set of process data cannot be recovered.

In some embodiments, the data processing unit is further configured to determine invalidity of at least a part of the allocation table and create a new allocation table in accordance with a determination that the allocation table is invalid. In some embodiments, the data processing unit is further configured to parse the non-volatile memory for process signatures, detect a process signature corresponding to a second set of process data and determine validity of the second set of process data.

In some embodiments, the data processing unit is further configured to add a second process descriptor corresponding to the second set of process data to the new allocation table in accordance with a determination that the second set of process data is valid. In some embodiments, the data processing unit is further configured to attempt to recover the second set of process data in accordance with a determination that the second set of process data is invalid and add a second process descriptor corresponding to a recovered second set of process data to the new allocation table in accordance with a determination that the second set of process data has been recovered.

The present disclosure relates to a data processing unit (DPU) of a plurality of data processing units of a computing system without a central processing unit and each data processing unit communicatively coupled to a non-volatile memory. In some embodiments the data processing unit is configured to determine validity of an allocation table of the data processing unit and retrieve a first process descriptor from the allocation table. The data processing unit may parse the non-volatile memory for a first set of process data corresponding to the first process descriptor, determine validity of the first set of process data corresponding to the first process descriptor and attempt to recover the first set of process data in accordance with a determination that the first set of process data is invalid.

In some embodiments, validity of the allocation table is determined at least in part on a correspondence of contents of the allocation table to a checksum value assigned to the allocation table. In some embodiments, validity of the first set of process data is determined at least in part on a correspondence of contents of the first set of process data to a checksum value assigned to the first set of process data.

In some embodiments, the data processing unit is further configured to retrieve the first process descriptor from the allocation table in accordance with a determination that the allocation table is valid. The data processing unit may further be configured to determine a failure to recover the first set of process data and remove the process descriptor corresponding to the first set of process data from the allocation table, in accordance with a determination that the first set of process data cannot be recovered.

In some embodiments the data processing unit is further configured to determine invalidity of at least a part of the allocation table and create a new allocation table in accordance with a determination that the allocation table is invalid. The data processing unit may be configured to parse the non-volatile memory for process signatures, detect a process signature corresponding to a second set of process data and determine validity of the second set of process data.

Additionally, in some embodiments, the data processing unit is further configured to add a second process descriptor corresponding to the second set of process data to the new allocation table in accordance with a determination that the second set of process data is valid. The data processing unit may be further configured to attempt to recover the second set of process data in accordance with a determination that the second set of process data is invalid and add a second process descriptor corresponding to a recovered second set of process data to the new allocation table in accordance with a determination that the second set of process data has been recovered.

A method is disclosed, of maintaining allocation table data of a data processing unit (DPU) of a plurality of DPUs of a computing system without a central processing unit and each DPU communicatively coupled to a non-volatile memory. In some embodiments, the method at the DPU comprises determining validity of an allocation table of the DPU and retrieving a first process descriptor from the allocation table. The method may further include parsing the non-volatile memory for a first set of process data corresponding to the first process descriptor, determining validity of the first set of process data corresponding to the first process descriptor and initiating recovery of the first set of process data in accordance with a determination that the first set of process data is invalid.

The method may include determining validity of the allocation table at least in part on a correspondence of contents of the allocation table to a checksum value assigned to the allocation table. The method may further include retrieving the first process descriptor from the allocation table in accordance with a determination that the allocation table is valid.

In some embodiments, the method further includes determining a failure to recover the first set of process data and removing the first process descriptor corresponding to the first set of process data from the allocation table, in accordance with a determination that the first set of process data cannot be recovered.

The method may further include determining invalidity of at least a part of the allocation table and creating a new allocation table in accordance with a determination that the allocation table is invalid. In some embodiments, the method includes parsing the non-volatile memory for process signatures, detecting a process signature corresponding to a second set of process data and determining validity of the second set of process data.

In some embodiments the method further includes adding a second process descriptor corresponding to the second set of process data to the new allocation table in accordance with a determination that the second set of process data is valid. The method may further include attempting to recover the second set of process data in accordance with a determination that the second set of process data is invalid, and adding a second process descriptor corresponding to a recovered second set of process data to the new allocation table in accordance with a determination that the second set of process data has been recovered.

In accordance with some implementations, the present disclosure relates to a computing system comprising a device. In some embodiments the device comprises a non-volatile memory divided into a plurality of memory sub-arrays, where each memory sub-array comprises a plurality of selectable locations and a plurality of data processing units communicatively coupled to the non-volatile memory in the absence of a central processing unit of the computing system, including a first data processing unit (DPU) assigned to process data of a memory sub-array. In some embodiments, the first DPU is configured to receive instructions to execute a parent process from a second data processing unit and transmit instructions to execute a child process associated with the parent process to a third data processing unit. The first data processing unit may also be configured to determine occurrence of a process failure at the third data processing unit and re-assign the child process for execution.

In some embodiments, the first data processing unit is further configured to transmit status information pertaining to the parent process to the second data processing unit in response to determining the occurrence of the process failure. The first data processing unit may be further configured to re-assign the child process to the third data processing unit. In some embodiments, the first data processing unit is further configured to re-assign the child process to a fourth data processing unit distinct from the third data processing unit.

The first data processing unit may be further configured to transmit a process termination message to the third data processing unit comprising instructions to terminate any further processing of the child process. In some embodiments, the first data processing unit is further configured to re-assign the child process to the fourth data processing unit on the basis of one or more re-assignment criteria. In some embodiments, one re-assignment criterion is the relative load of a respective data processing unit of the plurality of data processing units.

The first data processing unit may be further configured to determine a failure to receive status information from the third processing unit within a predetermined period of time and determine the occurrence of a process failure at the third data processing unit in response to determining the failure to receive status information from the third processing unit within the predetermined period of time.

In some embodiments, the first data processing unit is further configured to transmit a restart command to the third data processing unit in response to determining the failure to receive status information from the third processing unit within the predetermined period of time. The first data processing unit may be further configured to determine the occurrence of the process failure at the third data processing unit in response to receiving status information pertaining to the child process indicating failure to execute the child process.

The present disclosure relates to a method of responding to a process failure of a data processing unit of a plurality of data processing units of a computing system without a central processing unit and each data processing unit communicatively coupled with a non-volatile memory. In some embodiments, the method at a first data processing unit includes receiving instructions to execute a parent process from a second data processing unit and transmitting instructions to execute a child process associated with the parent process to a third data processing unit. The method may further include receiving status information pertaining to the child process indicating a process failure at the third data processing unit and re-assigning the child process for execution.

The present disclosure relates to an apparatus comprising means for receiving instructions to execute a parent process at a first data processing unit, from a second data processing unit of a plurality of data processing units of a computing system without a central processing unit and each data processing unit communicatively coupled with a non-volatile memory. In some embodiments, the apparatus includes means for transmitting instructions to execute a child process associated with the parent process to a third data processing unit and means for receiving status information pertaining to the child process indicating a process failure at the third data processing unit. The apparatus may include means for re-assigning the child process for execution.

The present disclosure relates to a computing system comprising a device. In some embodiments the device comprises a non-volatile memory divided into a plurality of memory sub-arrays, where each memory sub-array comprises a plurality of selectable locations and a plurality of data processing units communicatively coupled to the non-volatile memory in the absence of a central processing unit of the computing system, including a first data processing unit (DPU) assigned to process data of a memory sub-array. In some embodiments, the first data processing unit is configured to receive instructions to execute a parent process from a second data processing unit and transmit instructions to execute a child process associated with the parent process to a third data processing unit. The first data processing unit may further be configured to detect occurrence of a processing issue at the first data processing unit. In some embodiments, the first data processing unit is further configured to parse a jobs queue at the first data processing unit for unexecuted processes in response to detecting the occurrence of the processing issue at the first data processing unit, parse a tasks queue at the first data processing unit for unexecuted processes in response to detecting the occurrence of the processing issue at the first data processing unit and re-assign the child process for execution.

In some embodiments, the first data processing unit is further configured to retrieve a process descriptor pertaining to the parent process among the unexecuted processes listed in the jobs queue (e.g., the process descriptor used to retrieve executable code corresponding to the parent process). In some embodiments, the first data processing unit is further configured to retrieve a process descriptor pertaining to the child process among the unexecuted processes in the tasks queue, in response to retrieving a process descriptor pertaining to the parent process.

The first data processing unit may further be configured to transmit status information pertaining to the parent process to the second data processing unit in response to detecting the occurrence of the processing issue at the first data processing unit. In some embodiments, the first data processing unit is further configured to receive an execution confirmation command from the second data processing unit, corresponding to the parent process and in response to receiving the execution confirmation command, re-assign the child process for execution.

The first data processing unit may further be configured to retrieve a process descriptor pertaining to the child process among the unexecuted processes listed in the tasks queue. In some embodiments, the first data processing unit is further configured to re-assign the child process to the third data processing unit. The first data processing unit may further be configured to re-assign the child process to a fourth data processing unit distinct from the third data processing unit.

In some embodiments, the first data processing unit is further configured to transmit a process termination message to the third data processing unit comprising instructions to terminate any further processing of the child process. In some embodiments, the processing issue includes execution of a restart operation at the first data processing unit.

The present disclosure relates to a method of responding to a process failure of a data processing unit of a plurality of data processing units of a computing system without a central processing unit, where each data processing unit is communicatively coupled to a non-volatile memory. The method, performed at a first data processing unit, may include receiving instructions to execute a parent process from a second data processing unit and transmitting instructions to execute a child process associated with the parent process to a third data processing unit. The method may further include parsing a jobs queue at the first data processing unit for unexecuted processes in response to detection of an occurrence of a processing issue at the first data processing unit. In some embodiments the method includes parsing a tasks queue at the first data processing unit for unexecuted processes in response to detection of an occurrence of a processing issue at the first data processing unit and re-assigning the child process for execution.

The present disclosure relates to an apparatus comprising means for receiving instructions to execute a parent process at a first data processing unit from a second data processing unit of a plurality of data processing units, each data processing unit communicatively coupled with a non-volatile memory within a computing system without a central processing unit. The apparatus may further comprise means for transmitting instructions to execute a child process associated with the parent process to a third data processing unit and means for parsing a jobs queue at the first data processing unit for unexecuted processes in response to detection of an occurrence of a processing issue at the first data processing unit. In some embodiments the apparatus comprises means for parsing a tasks queue at the first data processing unit for unexecuted processes in response to detection of an occurrence of a processing issue at the first data processing unit and means for re-assigning the child process for execution.

The present disclosure relates to a computing system comprising a device. In some embodiments the device comprises a non-volatile memory divided into a plurality of memory sub-arrays, where each memory sub-array comprises a plurality of selectable locations and a plurality of data processing units communicatively coupled to the non-volatile memory in the absence of a central processing unit of the computing system, including a first data processing unit (DPU) assigned to process data of a memory sub-array. In some embodiments, the first data processing unit is configured to receive instructions to execute a parent process from a second data processing unit and transmit instructions to execute a child process associated with the parent process to a third data processing unit. The first data processing unit may further be configured to receive a first result associated with the child process from the third data processing unit, generate a second result by executing the parent process and transmit the second result to the second data processing unit. The first data processing unit may further be configured to determine a failure to receive a process completion acknowledgment from the second data processing unit and de-allocate memory corresponding to the parent process (e.g., by removing a process descriptor in an allocation table) at the first data processing unit in response to determining the failure to receive the process completion acknowledgment.

In some embodiments, the first data processing unit is further configured to receive new instructions to re-execute the parent process from the second data processing unit. The first data processing unit may further be configured to de-allocate memory corresponding to storage of the second result (e.g., executable code, data and/or completed results) in the memory sub-array, in response to receiving the new instructions. In some embodiments, the first data processing unit is further configured to add a process descriptor corresponding to the new instructions to a jobs queue at the first data processing unit, in response to receiving the new instructions.

The first data processing unit may further be configured to, in response to receiving the new instructions, retrieve the second result corresponding to the parent process from the memory sub-array and transmit the second result to the second data processing unit. In some embodiments, the first data processing unit is further configured to receive status information pertaining to the second data processing unit, indicating occurrence of a processing issue at the second data processing unit. In some embodiments the processing issue includes execution of a restart operation at the second data processing unit.

The first data processing unit may further be configured to determine an execution status of the parent process and transmit the execution status of the parent process to the second data processing unit at a predetermined frequency, in accordance with a determination that the parent process has not completed execution.

In some embodiments, the first data processing unit is further configured to receive a process termination message from the second data processing unit comprising instructions to terminate any further processing of the parent process.

The first data processing unit may further be configured to generate the second result by executing the parent process using the first result received from the third data processing unit and store the second result in the memory sub-array of the first data processing unit.

The present disclosure relates to a method of responding to a process failure of a data processing unit of a plurality of data processing units of a computing system without a central processing unit, where each data processing unit is communicatively coupled to a non-volatile memory. The method, performed at a first data processing unit, may include receiving instructions to execute a parent process from a second data processing unit and transmitting instructions to execute a child process associated with the parent process to a third data processing unit. The method may further include receiving a first result associated with the child process from the third data processing unit, generating a second result by executing the parent process and transmitting the second result to the second data processing unit.

In some embodiments, the method includes determining a failure to receive a process completion acknowledgment from the second data processing unit and de-allocating memory corresponding to the parent process (e.g., by deleting a corresponding process descriptor in an allocation table) at the first data processing unit in response to determining the failure to receive the process completion acknowledgment.

The present disclosure relates to an apparatus comprising means for receiving instructions to execute a parent process at a first data processing unit from a second data processing unit of a plurality of data processing units, each data processing unit communicatively coupled with a non-volatile memory within a computing system without a central processing unit. The apparatus may comprise means for transmitting instructions to execute a child process associated with the parent process to a third data processing unit, and means for receiving a first result associated with the child process from the third data processing unit. In some embodiments the apparatus includes means for generating a second result by executing the parent process and means for transmitting the second result to the second data processing unit. The apparatus may include means for determining a failure to receive a process completion acknowledgment from the second data processing unit and means for de-allocating memory corresponding to the parent process (e.g., by deleting a process descriptor in an allocation table) at the first data processing unit in response to determining the failure to receive the process completion acknowledgment.

The present disclosure relates to a computing system comprising a device. In some embodiments the device comprises a non-volatile memory divided into a plurality of memory sub-arrays, where each memory sub-array comprises a plurality of selectable locations and a plurality of data processing units communicatively coupled to the non-volatile memory in the absence of a central processing unit of the computing system, including a data processing unit (DPU) assigned to process data of a memory sub-array. In some embodiments, the data processing unit is configured to determine that one or more root process generation criteria have been satisfied, select a hosting data processing unit to host a new root process based on one or more hosting criteria and assign the new root process to the hosting data processing unit.

In some embodiments, a first root process generation criterion is satisfied in accordance with a determination that a number of total root processes among the plurality of data processing units is less than a predefined threshold value. In some embodiments, a first hosting criterion is satisfied in accordance with a determination that the hosting data processing unit has less than a predefined number of processes in its jobs queue. In some embodiments, a second hosting criterion is satisfied in accordance with a determination that the hosting data processing unit is not currently hosting a root process.

The present disclosure relates to a method of responding to a process failure of a data processing unit of a plurality of data processing units of a computing system without a central processing unit, where each data processing unit is coupled with a non-volatile memory. The method, performed at a data processing unit, may include determining that one or more root process generation criteria have been satisfied, selecting a hosting data processing unit to host a new root process based on one or more hosting criteria, and assigning the new root process to the hosting data processing unit.

The present disclosure relates to an apparatus comprising means for determining at a first data processing unit of a plurality of data processing units, each data processing unit coupled with a non-volatile memory within a computing system without a central processing unit, that one or more root process generation criteria have been satisfied. The apparatus may comprise means for selecting a hosting data processing unit to host a new root process based on one or more hosting criteria and means for assigning the new root process to the hosting data processing unit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
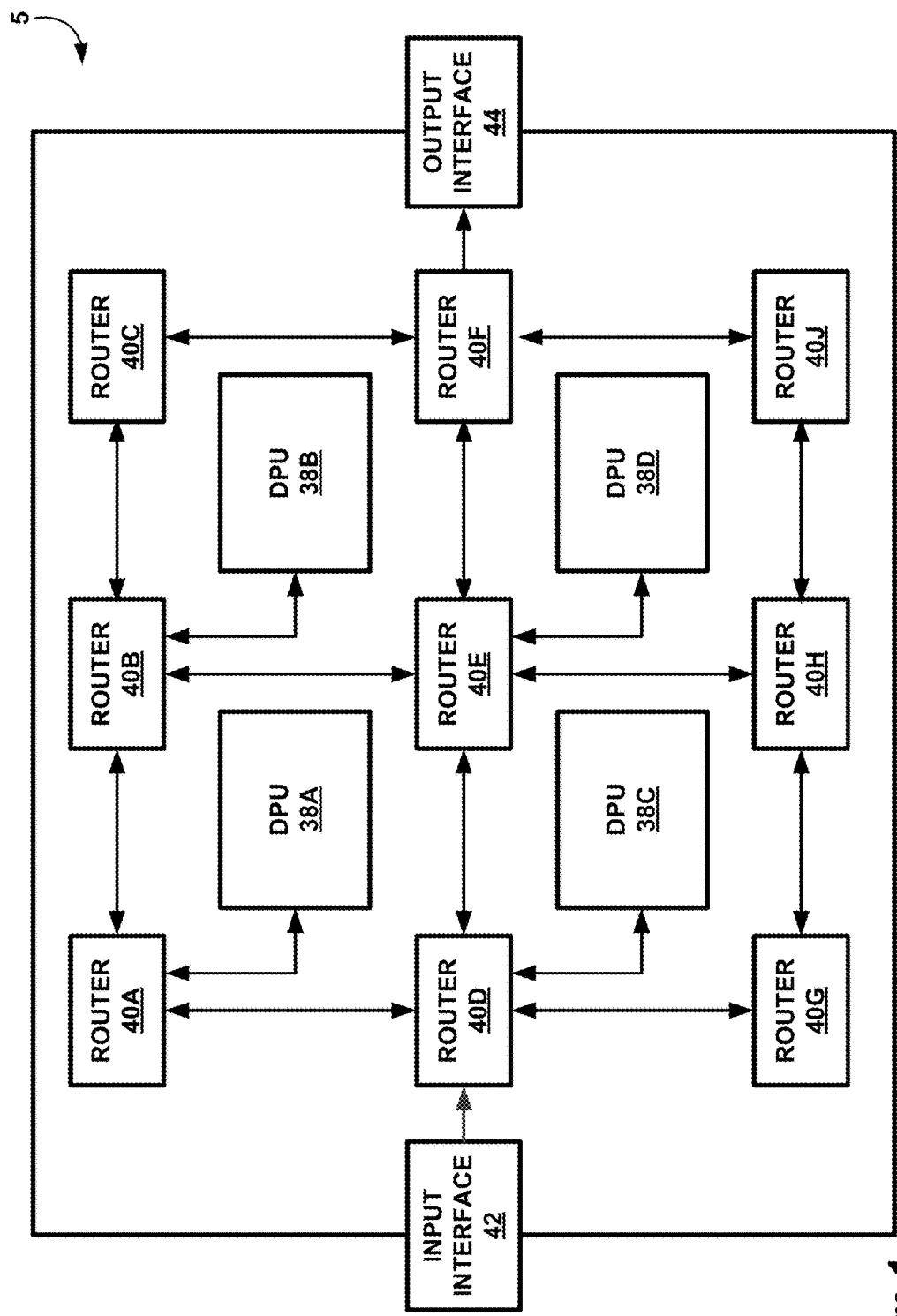
FIG. 1 is a block diagram illustrating an example computing system that includes a plurality of data processing units (DPUs) according to one or more embodiments.

While certain embodiments are described, these embodiments are presented by way of example only and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

The headings provided herein are for convenience only and do not necessarily affect the scope or meaning of the claimed invention. Disclosed herein are examples, implementations, configurations, and/or embodiments relating to restarting data processing units.

PiNVSM Computing Architecture Overview

In accordance with one or more embodiments, a computing architecture is disclosed in which a set of one or more processing units are each associated with a portion of persistent data storage and may process data in-place. For instance, a "processor-in-non-volatile-storage-memory" (PiNVSM) device on a semiconductor chip may be able to persistently store large amounts of data and to process the persistently stored data without the use of a central processing unit (CPU). In this example, as both the one or more processing units and the non-volatile storage memory (NVSM) are included on the same chip or packaging, the rate at which the one or more processing units may access data stored by the NVSM (i.e., latency) may be reduced. In some embodiments, a PiNVSM device may be implemented on a single semiconductor chip and may include a processing unit connected to an associated memory subarray of non-volatile memory. In some embodiments, a PiNVSM device may be implemented in a packaged module. A PiNVSM system may include a plurality of PiNVSM devices connected to each other in various configurations via various communication buses or channels (wired or wireless).

In some embodiments, one or more processing units of a PiNVSM device perform various mathematical and/or logic operations. In some embodiments, a PiNVSM device includes one or more arithmetic logic units (ALUs). For example, the ALUs may each be configured to perform integer arithmetic and logical operations (e.g., AND, NAND, OR, NOR, XOR, NOT). In some embodiments, the PiNVSM device may include one or more floating point units (FPUs), which may each be configured to perform non-integer calculations, such as division operations, which may generate a fraction, or a "floating point" number. In some examples, the PiNVSM device may include both one or more processing units (PU), and one or more field-programmable gate arrays (FPGAs). Processing units in some embodiments may be pre-fabricated in hardware to perform specific computations or data manipulations. For example, the processing units may be pre-fabricated with only specific circuit logic (such as ASICs) to perform a specific calculation. Alternatively, processing units may be programmable processing units that can be programmed dynamically to perform computations or data manipulations based on execution codes.

FIG. 1 is a block diagram illustrating an example computing system that includes a plurality of data processing units (DPUs) according to one or more embodiments. For the purpose of illustration, a PiNVSM device may, in some embodiments, be a single semiconductor chip and may include a processing unit connected to an associated memory subarray of non-volatile memory. As shown in FIG. 1, computing system 5 may include one or more data processing units (DPUs) 38A-38D (collectively, "DPUs 38"), one or more routers 40A-40J (collectively, "routers 40"), input interface 42, and output interface 44. In some examples, computing system 5 may be a standalone computing system where a separate host device is not present.

Input interface 42 may be configured to obtain input data. For instance, input interface 42 may obtain digital audio data, digital video data, text data (i.e., entered via keyboard), position data (i.e., entered via a mouse), and any other type of digital data. Output interface 44 may be configured to provide output data. For instance, output interface 44 may output digital audio data, digital video data, one or more management actions, and any other type of output data.

Routers 40 may each be configured to route data around computing system 5. In some examples, routers 40 may form a network on chip (NoC) architecture, such as the NoC architecture discussed in U.S. patent application Ser. No. 14/922,547 Titled "Fabric Interconnection for Memory Banks Based on Network-On-Chip Methodology" filed on Oct. 26, 2015 and/or U.S. patent application Ser. No. 14/927,670 Titled "Multilayer 3D Memory Based on Network-On-Chip Interconnection" filed on Oct. 27, 2015. As shown in FIG. 1, routers 40 may be interconnected via wires, traces, or any other conductive means. Routers 40 may route data and/or instructions around computing system 5. For instance, routers 40 may enable the transport/transfer/exchange of data and/or instructions amongst DPUs 38, input interface 42, and/or output interface 44. By enabling a NoC architecture, routers 40 may enable a reduction in a size of computing system 5 (i.e., as separate tracks between components may be eliminated).

DPUs 38 may each be configured to store and process data. DPUs 38 may each include a plurality of PiNVSM devices and as such, may include one or more processing units and a non-volatile memory array (NVMA) (e.g., comprising subarrays of non-volatile memory). For the purpose of illustration, a PiNVSM device may be a single semiconductor chip and may include one or more processing units connected to one or more associated memory subarrays of non-volatile memory.

Structure of a DPU

Figure 2:
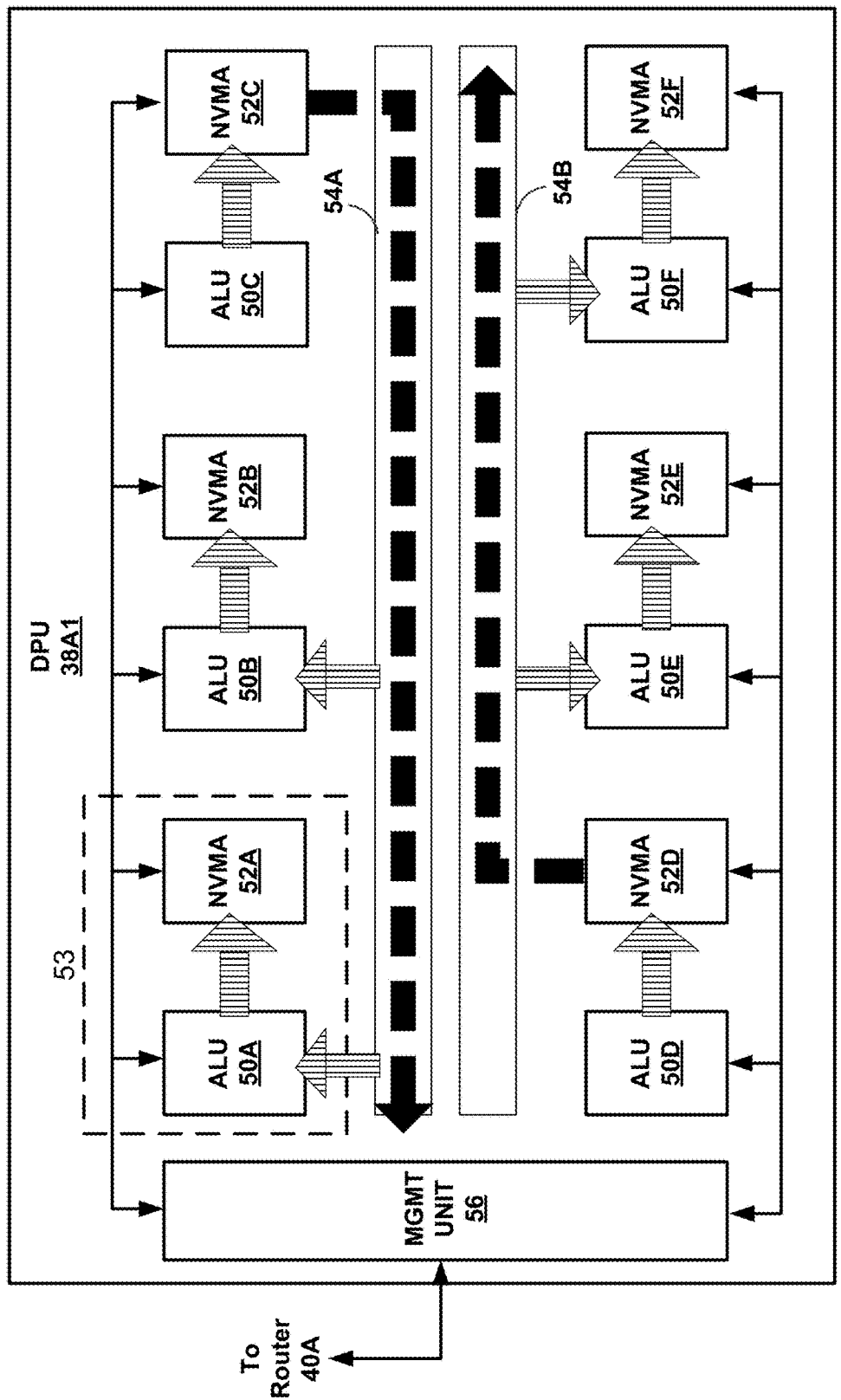
FIG. 2 is a block diagram illustrating an example data processing unit (DPU) according to one or more embodiments.

FIG. 2 is a block diagram illustrating an example data processing unit (DPU) according to one or more embodiments. DPU 38A1 in FIG. 2 may be an example of DPU 38A of FIG. 1. As shown in FIG. 2, DPU 38A1 includes arithmetic logic units (ALUs) 50A-50F (collectively, ALUs 50"), non-volatile memory arrays (NVMAs) 52A-52F (collectively, "NVMAs 52"), NVMAs 54A and 54B (collectively, "NVMAs 54"), and management unit 56. For the purpose of illustration, a PiNVSM device may be a single semiconductor chip and may include a processing unit (such as one of the ALUs 50A-50F) connected to an associated memory subarray of non-volatile memory (such as one of the NVMAs 52A-52F). For example, a PiNVSM device 53 may be represented by the dashed outline encompassing ALU 50A and NVMA 52A as shown in FIG. 2. Alternatively, a PiNVSM device may comprise a plurality of DPUs and a plurality of non-volatile memory sub-arrays of a collective non-volatile memory array, such as computing system 5 of FIG. 1.

Management unit 56 may be configured to control operation of one or more components of DPU 38A1. As shown in FIG. 2, management unit 56 may control operation of ALUs 50, NVMAs 52, and NVMAs 54. Management unit 56 may communicate with one or more components external to DPU 38A1, such as router 40A of FIG. 1.

NVMAs 52 may each represent an array of non-volatile memory that may be programmed and erased on the basis of selectable memory locations without altering data stored at other selectable memory locations. In some examples, NVMAs 52 may include any type of non-volatile memory device that may perform selectable memory location level programming and erasing without altering data stored at other selectable levels. For example, each bit in NVMAs 52 may be independently alterable without altering data stored in other bits in NVMAs 52. That is, NVMAs 52 may be configured to write a "0" or a "1" (or alter the storage state) of any single bit without changing any other accessible bit in normal operations. In some granularities, NVMAs 52 may be configured to be byte-wise alterable, word-wise alterable, double-word-wise alterable, quad-word-wise alterable, etc. This effectively allows the NVMAs 52 to have data overwritten in any granularity down to a single bit location, without the necessity of having to first "erase" an entire block of bits (as in traditional Flash Memory). In some examples, NVMAs 52 may be storage class memory. Some examples, of NVMAs 52 include, but are not limited to phase-change memory (PCM) devices, resistive random-access memory (ReRAM) devices, magnetoresistive random-access memory (MRAM) devices, ferroelectric random-access memory (FeRAM), holographic memory devices, and any other type of non-volatile memory devices capable of being written to at a location level without altering data stored at other selectable levels.

In some examples, NVMAs 52 and 54 may use multiple levels of granularity to access data (i.e., without the need to have fixed page sizes). For instance, in each of the selectable locations, NVMAs 52 and 54 may work with pages, without pages, with 4K, 6K, 18K, etc., blocks of data, or 64 bytes, 128 bytes, 256 bytes, etc. at a time. In some examples, an NVMA of NVMAs 52 and 54 may modify its internal organization on-the-fly. For instance, in each of the selectable locations, an NVMA of NVMAs 52 and 54 may change partitions, change banks organization, data line association, addressable area, accessible area, and/or blocks size.

NVMAs 54 may each represent an array of non-volatile memory that may be programmed and erased at the selectable location level without altering data stored at other selectable locations. In some embodiments, NVMAs 54 include non-volatile memory used as an execution conveyor and readily accessible by all other processing units and memory arrays of DPU 38A1.

ALUs 50 may be configured to manipulate data stored within NVMAs 52. For instance, each respective ALU of ALUs 50 may be configured to manipulate data within a corresponding NVMA of NVMAs 52. In the example shown in FIG. 2, ALU 50A may be configured to manipulate data within NVMA 52A, ALU 50B may be configured to manipulate data within NVMA 52B, and ALU 50F may be configured to manipulate data within NVMA 52F. In some examples, each ALU of ALUs 50 may be an elementary ALU.

The vertically shaded arrows in FIG. 2 may represent a management and execution flow amongst the components of DPU 38A1. Similarly, the thick, solid arrows in FIG. 2 may represent instruction set flows amongst the components of DPU 38A1.

Figure 3:
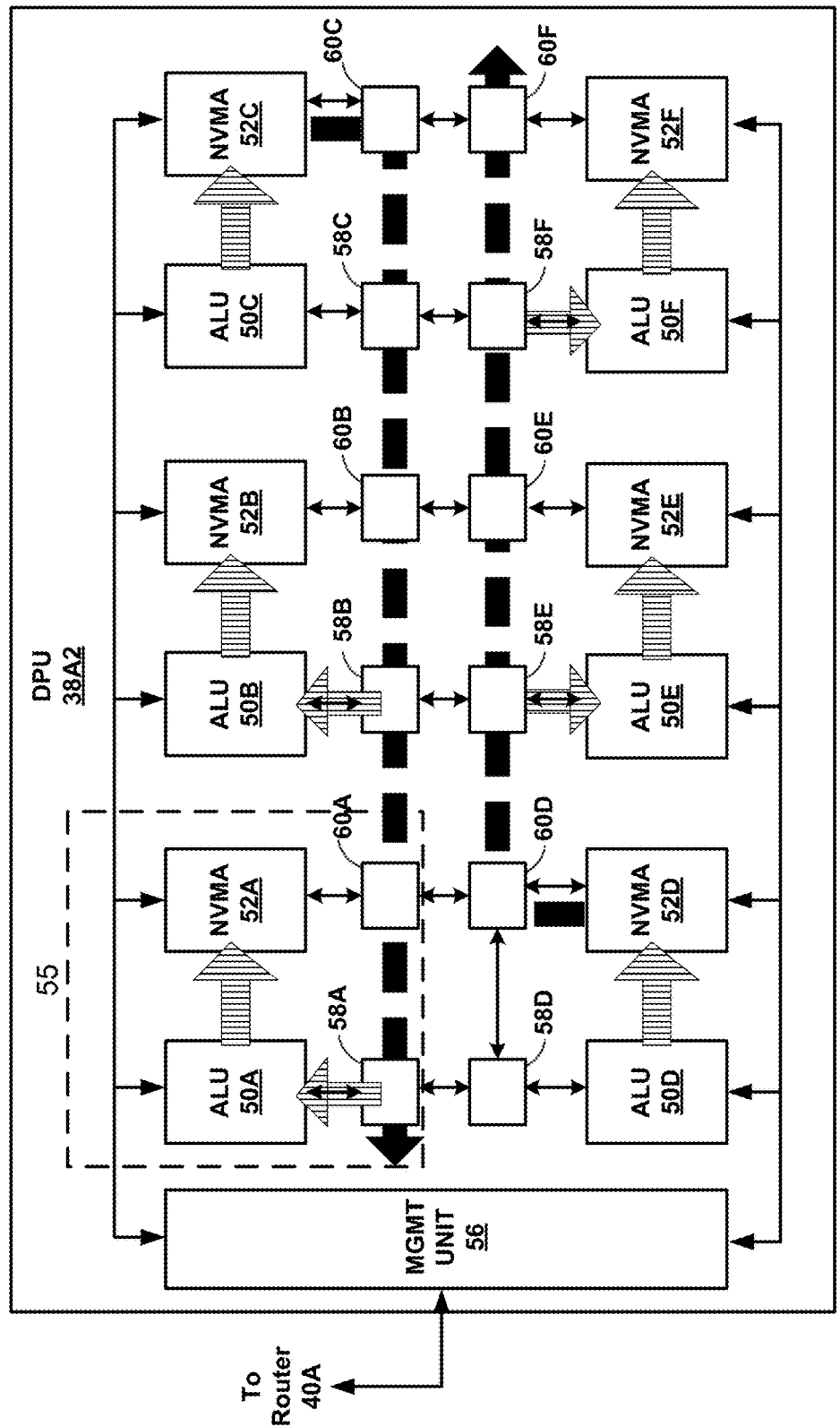
FIG. 3 is a block diagram illustrating another example data processing unit (DPU) according to one or more embodiments.

FIG. 3 is a block diagram illustrating another example data processing unit (DPU) according to one or more embodiments. DPU 38A2 in FIG. 3 may be another example of DPU 38A of FIG. 1. Similar to DPU 38A1, DPU 38A2 includes ALUs 50, NVMAs 52, and management unit 56. In addition, DPU 38A2 includes a first plurality of routers 58A-58F (collectively, "routers 58"), and a second plurality of routers 60A-60F (collectively, "routers 60").

Routers 58 and routers 60 may function as a network-on-chip (NoC) within DPU 38A2 to move data amongst components of DPU 38A2. For instance, routers 58 and routers 60 may move data amongst ALUs 50 and/or NVMAs 52. In some examples, routers 58 and routers 60 may operate on different channels and/or different operating protocols and frequencies, according to different priorities.

Similar to the example of FIG. 2, the vertically shaded arrows in FIG. 3 may represent a management and execution flow amongst the components of DPU 38A2 and the thick solid arrows in FIG. 3 may represent instruction set flows amongst the components of DPU 38A2. In some embodiments, a PiNVSM device in this DPU format may include a processing unit (such as one of the ALUs 50A-50F) connected to an associated memory subarray of non-volatile memory (such as one of the NVMAs 52A-52F), as well as one or more routers (such as one of routers 58A-58F and/or routers 60A-60F). For example, a PiNVSM device 55 may be represented by the dashed outline encompassing ALU 50A and NVMA 52A, as well as router 58A and 60A as shown in FIG. 3. Alternatively, a PiNVSM device may comprise a plurality of DPUs and a plurality of non-volatile memory sub-arrays of a collective non-volatile memory array, such as computing system 5 of FIG. 1.

Storage Space in NVSM

Figure 4:
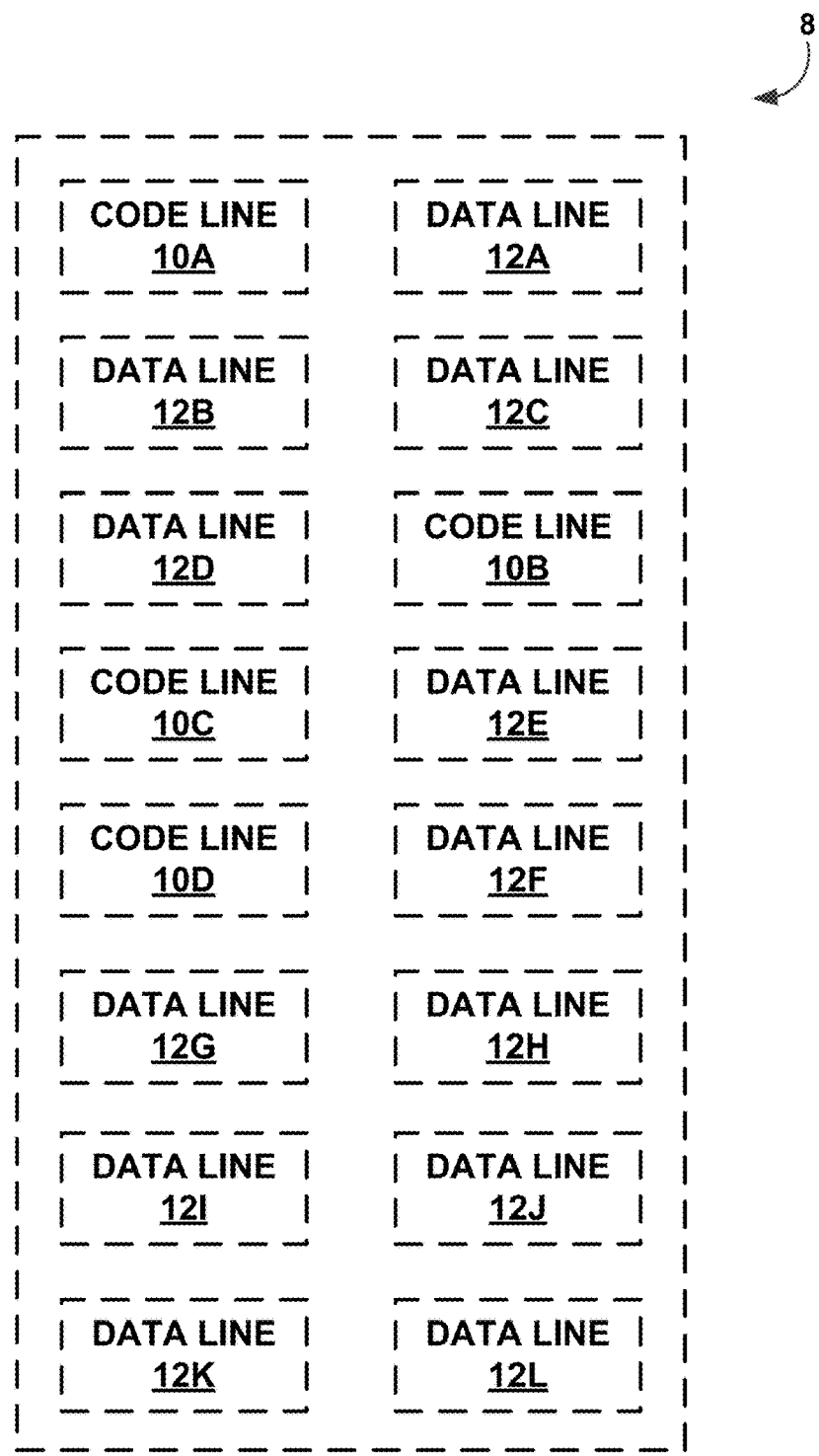
FIG. 4 is a block diagram illustrating an example storage space of a non-volatile memory storage device according to one or more embodiments.

FIG. 4 is a block diagram illustrating an example storage space of a non-volatile memory storage device according to one or more embodiments. In operation, processing units of DPUs (e.g., within one or more PiNVSM devices) may perform data manipulation based on data in selected locations of NVMA included in DPUs to generate corresponding results of the data manipulation. For instance, a processing unit may be configured to compute results for data in one or more associated data lines. As one example, a particular processing unit included in a DPU may be configured to compute results for data in a data line associated with the particular processing unit. The results of the computation may be stored in the associated data lines reserved for the results. Initial data used for the computation are only overwritten when specifically intended for overwrites. The processing units may cause NVMAs included in the DPUs to selectively program and erase data in selectable locations reserved to store results of the data manipulation based on the corresponding results. For instance, each of the processing units included in a DPU may be configured to selectively write, based on the corresponding results, data in a results portion of an associated data line.

In some examples, the processing units may perform the data manipulation based on instruction sets, such as execution code. In some embodiments, instruction sets are stored by DPUs as code lines. In some examples, the execution code in each of the code lines may contain a sequence of instructions. In some examples, a management unit may be configured to obtain the instruction sets.

As shown in FIG. 4, storage space 8 includes code lines 10A-10D (collectively, "code lines 10"), and data lines 12A-12L (collectively, "data lines 12"). In some embodiments, data lines 12 may each include some user data. For instance, each data line of data lines 12 may be an array of data items with associated operations. Also as discussed above, code lines 10 may each include an instruction set (i.e., a software primitive, execution code) that can be used for manipulation of user data of data lines 12. In other words, a code line of code lines 10 may be a sequence of operations with the prepared environment that can be used for transformation of user data of data lines 12.

In some examples, code may be simply stored as data and it can be treated as a data line. Otherwise, the code may be copied into a particular location (e.g., a special place or execution conveyor, for example) that will be treated as a sequence of instructions (code line 10). After being used to manipulate data, a code line of code lines 10 may be transformed in data line of data lines 12 that will store results of the data manipulation and/or executable code.

Figure 5:
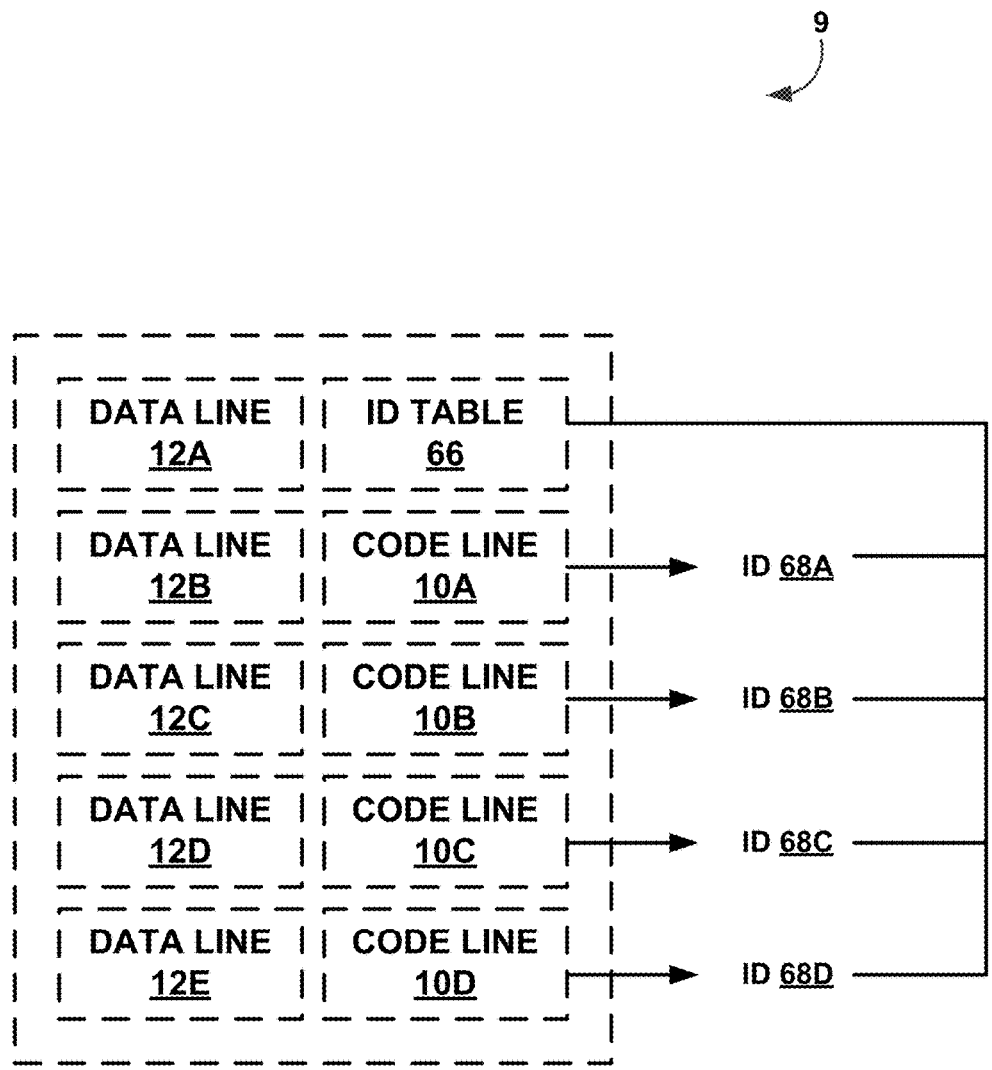
FIG. 5 is a block diagram illustrating another example storage space of a non-volatile memory storage device according to one or more embodiments.

FIG. 5 is a block diagram illustrating another example storage space of a non-volatile memory storage device according to one or more embodiments. As shown in FIG. 5, similar to storage space 8 of FIG. 4, storage space 9 includes code lines 10, and data lines 12. As also shown in FIG. 5, storage space 9 includes ID table 66.

ID table 66 may store an identification number of each instruction set (i.e., code line). For instance, ID table 66 may store a respective identification number of identification numbers 68A-68D (collectively, "IDs 68") for each of code lines 10A-10D. In some examples, each of IDs 68 may be an Inode ID, a globally unique identifier (GUID), or a hash value of the corresponding instruction set. For instance, ID 68A may be an Inode ID or a hash value of an instruction set included in code line 10A. In some examples, IDs 68 may be referred to as fingerprints of their corresponding instruction sets. In some examples, ID table 66 may be included in a hash table of a DPU, such as a DPU of DPUs 38 of FIG. 1.

Figure 6B:
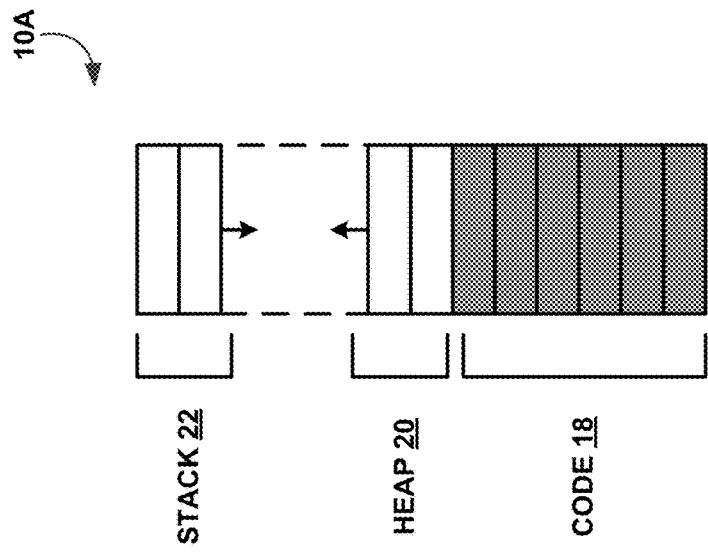
FIG. 6B is a block diagram illustrating an example structure of a code line that may be included in a PiNVSM device according to one or more embodiments.
Figure 6A:
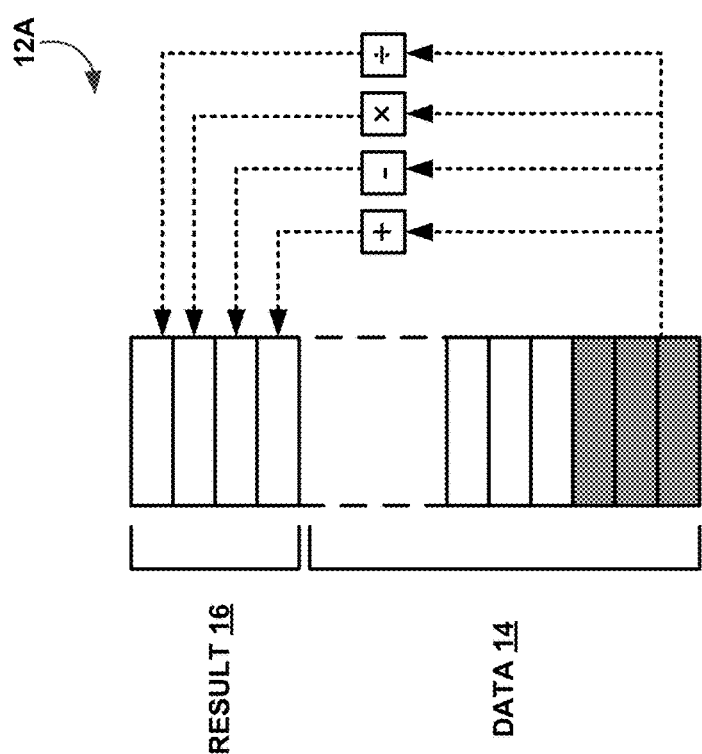
FIG. 6A is a block diagram illustrating an example structure of a data line that may be included in a processor-in-non-volatile-storage-memory (PiNVSM) device according to one or more embodiments.

FIG. 6A is a block diagram illustrating an example structure of a data line that may be included in a processor-in-non-volatile-storage-memory (PiNVSM) device according to one or more embodiments. In the NVSM, programming and erasing of data may be performed on the basis of a selectable memory location level. For instance, the NVSM may be divided into a plurality of selectable memory locations and the processing units may be able to program data or erase data at a particular selectable memory location of the plurality of selectable memory locations without altering data stored at other selectable memory locations of the plurality of selectable memory locations. Some examples of NVSM include, but are not necessarily limited to, magnetoresistive random-access memory (MRAM), ferroelectric random-access memory (FeRAM), NRAM, resistive random-access memory (ReRAM), Phase Change Memory (PCM), and Mott memory.

As shown in FIG. 6A, data line 12A includes data portion 14 and results portion 16. Data portion 14 may correspond to one or more selectable locations of a PiNVSM device that store data, such as one or more selectable locations of an NVMA of NVMAs 52 of FIG. 2. Results portion 16 may correspond to one or more selectable locations of the non-volatile storage device that store results of manipulation of data, such as data stored in data portion 14. Data line 12A may be a logical structure and the selectable locations of data portion 14 and/or results portion 16 may or may not be contiguously located (meaning, in other words, may or may not have sequential physical addresses). The selectable locations that correspond to data portion 14 and the selectable locations that correspond to results portion 16 may be considered to be grouped into data line 12A.

In some examples, the selectable memory locations may be addressable memory locations. For instance, each of the selectable memory locations may have a unique numerical address, and data associated with a particular addressable memory location may be accessed/read/written via a unique address of the particular addressable memory location. In some examples, data at a particular addressable memory location may be accessed/read/written via an access system.

In operation, one or more processing units of a PiNVSM device may perform data manipulation based on data in selected locations of non-volatile memory of the PiNVSM device, generate corresponding results of the data manipulation, and cause the non-volatile memory to selectively program and erase data in selectable locations reserved to store results of the data manipulation based on the corresponding results. As the programming and erasing of data may be performed at the selectable location level, the one or more processing units may cause the non-volatile memory to selectively program and erase data in selectable locations reserved to store results of the data manipulation without altering data stored at selectable locations other than the selectable locations reserved to store results of the data manipulation.

In some examples, the non-volatile memory space may be shared between data lines and code lines. In general, a data line may include user data. A code line may include an instruction set (i.e., a software primitive, execution code) that can be used for manipulation of data lines. Each of the data lines may include one or more selectable locations and may be associated with a processing unit. In other words, the selectable locations of the non-volatile memory may be grouped into a plurality of data lines. In some examples, at any given time, a particular selectable location may only be grouped into a single data line. As such, in some examples, the PiNVSM device may have a unique mapping between selectable locations and data lines (or code lines) such that a single selectable location is not included in two data lines (or two code lines) at the same time.

In some examples, the grouping of selectable locations into data lines may be adjustable over time. For instance, at a first time, a first group of selectable locations of a plurality of selectable locations may be associated with a particular data line that is associated with a particular processing unit. At a second time, a second group of selectable locations of the plurality of selectable locations may be associated with the particular data line. The second group of selectable locations may be different than the first group of selectable locations (i.e., include a selectable location not included in the first group and/or omit a selectable location included in the first group).

FIG. 6B is a block diagram illustrating an example structure of a code line that may be included in a PiNVSM device according to one or more embodiments. As shown in FIG. 6B, code line 10A includes code portion 18, heap portion 20, and stack portion 22. Code portion 18 may correspond to one or more selectable locations of a non-volatile storage device that store an instruction set (e.g., a software primitive) that may be used to manipulate data. Heap portion 20 and stack portion 22 may each correspond to one or more selectable locations of a non-volatile storage device respectively used as a heap and a stack during data manipulation. Code line 10A may be a logical structure and the selectable locations of code portion 18, heap portion 20, and/or stack portion 22 may or may not be contiguously located (meaning, in other words, that these portions 18-22 may or may not be stored to memory locations having have sequential physical addresses).

Networking of DPUs

Figure 7:
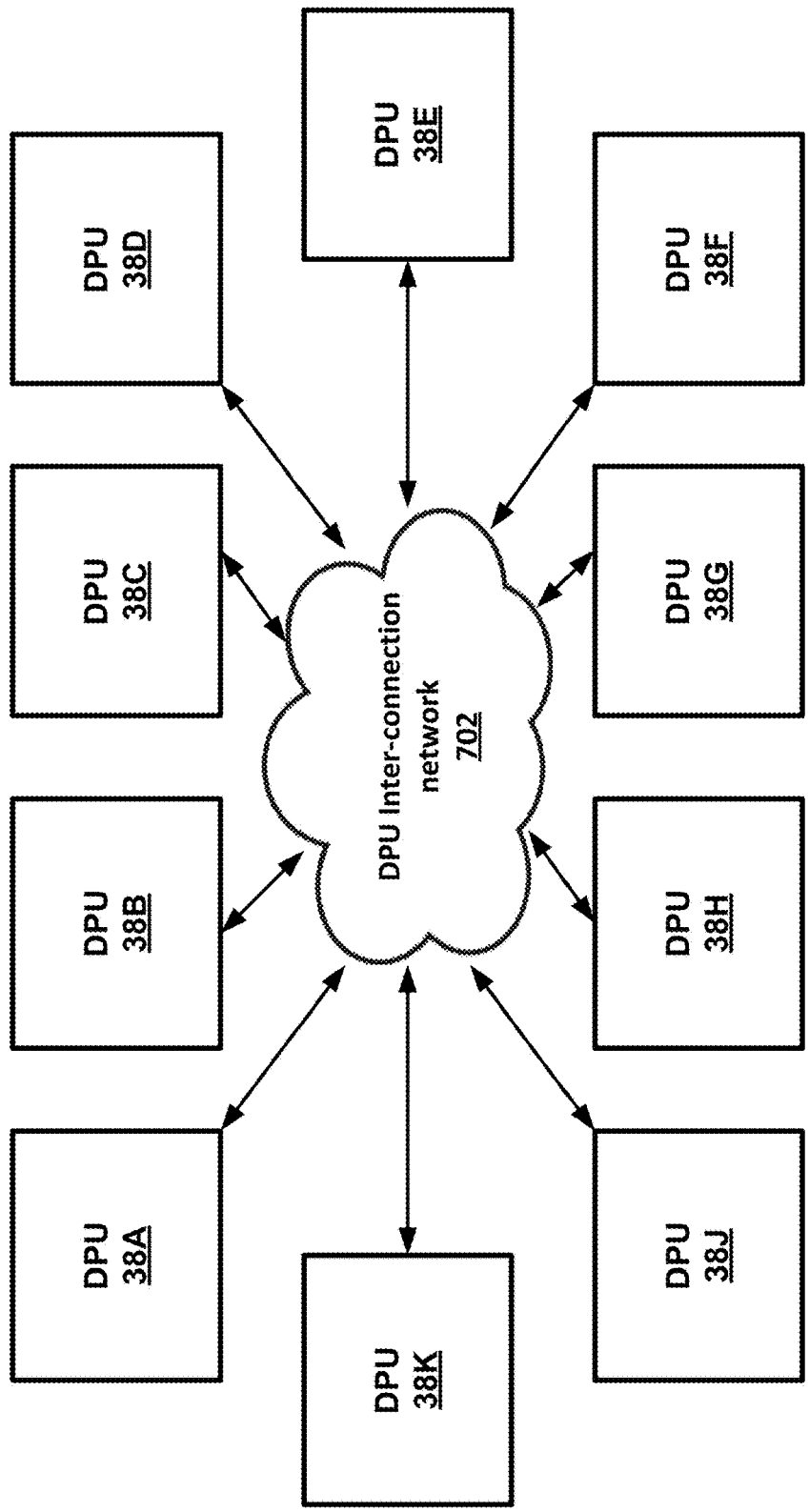
FIG. 7 is a block diagram illustrating an example networked structure of a set of data processing units according to one or more embodiments.

FIG. 7 is a block diagram illustrating an example networked structure of a set of data processing units according to one or more embodiments. As shown in FIG. 7, a set of one or more DPUs 38 (e.g., within a particular computing system, such as shown in FIG. 1), may be in communication with each other using a DPU inter-connection network 702. In some embodiments, network 702 is implemented by one or more routers, such as described above with reference to FIG. 1. In some embodiments, a DPU inter-connection network 702 is implemented within a computing system such as the one described with respect to FIG. 1.

In some embodiments, DPUs 38 may be directly interconnected via wires, traces, or any other conductive means. These conductive means may allow routing of data and/or instructions from one DPU 38 to another. For example, network 702 may be implemented by physical connections from a given DPU 38 (e.g., DPU 38G) to a sub-group of all the DPUs 38 in the network 702 (e.g., DPU 38G is connected to DPU 38H and DPU 38F). These sub-groups of connected DPUs 38 may effectively result in all DPUs 38 of a computing system having a link to the DPU inter-connection network 702. In some embodiments, a respective DPU 38 associated with (e.g., connected to) DPU inter-connection network 702 is configured to perform one or more functions of a router, such as transferring data and/or instructions from a first DPU to a second DPU. For example, DPU 38G may be physically connected to DPU 38H which may be physically connected to DPU 38J. In this example, DPU 38H may function as a router to transfer a set of instructions from DPU 38G to DPU 38J.

Figure 8:
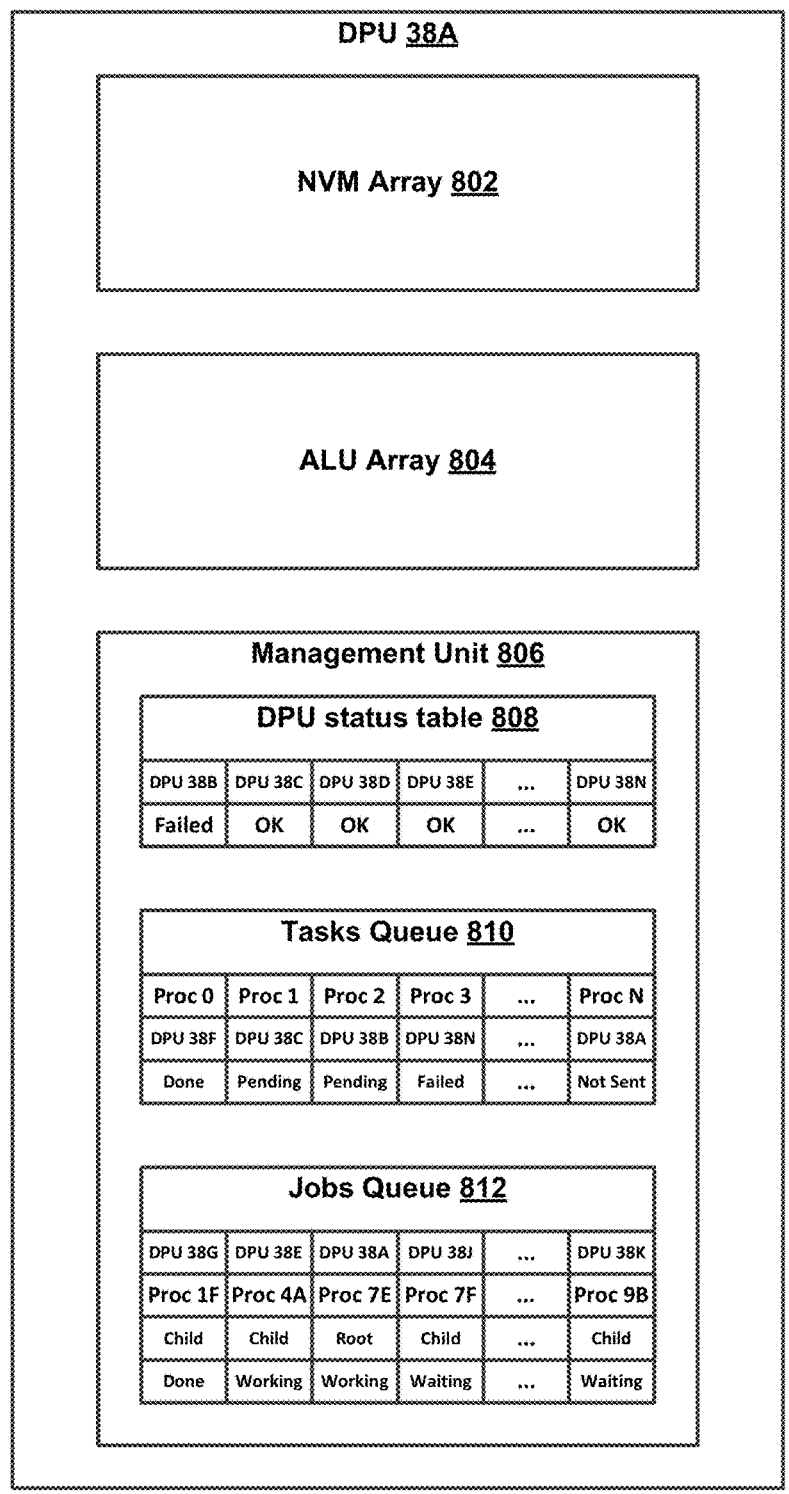
FIG. 8 is a block diagram illustrating an example structure of a management unit of a data processing unit according to one or more embodiments.

FIG. 8 is a block diagram illustrating an example structure of a management unit 806 of a data processing unit 38A, according to one or more embodiments. In this example, all the non-volatile storage of DPU 38A is abstracted to NVM Array 802. In some embodiments, NVM Array 802 comprises a plurality of non-volatile memory arrays, portions or sections, such as described above with respect to FIGS. 2 and 3. For example, DPU 38A may include a set of PiNVSM devices, each PiNVSM device of the set comprising a portion of non-volatile storage memory on-chip. Similarly, in some embodiments ALU Array 804 comprises a plurality of processing units and/or arithmetic logic units such as found on one or more PiNVSM devices of DPU 38A.

In some embodiments, a DPU such as DPU 38A includes a management unit 806. As described above with respect to FIGS. 2 and 3, a management unit 806 may be configured to control operation of one or more components of DPU 38A such as NVM Array 802 and/or ALU Array 804. In some embodiments, management unit 806 may communicate with one or more components external to DPU 38A, such as a router and/or other DPUs.

Management unit 806 of FIG. 8 is shown to include a DPU status table 808 and a tasks queue 810. In some embodiments, a DPU status table 808 includes information such as one or more identifiers (e.g., serial number, or a globally unique identifier (GUID)) for a respective DPU of the same DPU inter-connection network of which DPU 38A is a member. For example, DPU 38A is in a DPU inter-connection network (as described with respect to FIG. 7), with DPU 38B up to DPU 38N. In this example, there is at least one identifier for each of the other or "peer" DPUs of the DPU inter-connection network. In addition to an identifier, DPU status table 808 includes status information for the one or more peer DPUs of the DPU inter-connection network. For example, status information may indicate whether or not a peer DPU is "frozen" or unresponsive to communications from DPU 38A. In some embodiments, status information in DPU status table 808 may indicate a lack of received communication from a peer DPU of the DPU inter-connection network. For example, a particular DPU, such as DPU 38B may be indicated to have a status failure if DPU 38A does not receive a communication from DPU 38B within a predefined duration of time.

Tasks queue 810 illustrates an example of a listing of processes that will have corresponding instructions transmitted by management unit 806 to one or more DPUs of the DPU inter-connection network. In some embodiments, a tasks queue 810 includes one or more identifiers (e.g., serial number, an (node ID, or a globally unique identifier (GUID)) for a respective process. In some embodiments, a respective process (e.g., process 0) is associated with a respective DPU of the DPU inter-connection network. In some embodiments, a process listed within tasks queue 810 is associated with the same DPU itself. For example, as shown in FIG. 8, instructions corresponding to process N are assigned to DPU 38A itself. Tasks queue 810 may have some identifying information for a respective DPU associated with a respective process in the queue. In some embodiments, a respective process in tasks queue 810 has an identifier related to the other processes in the queue. For example, the second process in tasks queue 810 of management unit 806 of DPU 38A may be labeled as "Process 1". In some embodiments, a respective process in tasks queue 810 has a globally unique identifier (GUID) or some other identifier that is specific to the process within the entire network of DPUs and the entire computing system.

Tasks queue 810 may also indicate the status of a respective process listed in the queue. For example, as shown in FIG. 8, a status of "Process 0" is listed as "Done," while a status of "Process 3" is listed as "Failed". In some embodiments a status is simply a binary flag indicating completion or not, while in some embodiments it is more qualitative. For example, "Process 1" is listed as "Pending" (e.g., in progress, working, incomplete, in process), while "Process N" is listed as "Not Sent" (i.e., instructions for Process N have not been sent to DPU 38A yet). As described above, in some embodiments a respective DPU may assign a process (e.g., a child process) to be completed at the respective DPU. As such, the respective DPU may not transmit instructions to itself, as it would for assigning a process to another DPU. The respective DPU may create a corresponding entry for the process in the jobs queue 812 instead.

In some embodiments, processes in tasks queue 810 are child processes of one or more parent processes assigned to DPU 38A to complete. For example, a process in tasks queue 810 may be a derivative of a process in jobs queue 812. In some embodiments, jobs queue 812 is configured to list processes assigned to be completed by the DPU at which the jobs queue 812 resides. In the example shown in FIG. 8, jobs queue 812 corresponds to a list of processes assigned to be completed by DPU 38A. Jobs queue 812 may comprise identifying information pertaining to each respective process, such as a serial number, or a globally unique identifier (GUID)). Each process in jobs queue 812 may also have an associated and identified DPU, for instance a DPU from which instructions pertaining to the process were received, or pointers to such instructions were received. For example, "Process 7F" is a child process assigned to DPU 38A by DPU 38J. In some embodiments, a process in jobs queue 812 is further qualified by the nature of the process. In some embodiments a process can be a root process (e.g., an originating operating system process at the highest level of hierarchy), or a child process of a root or another process. In some embodiments, a process is added to the respective jobs queue 812 of a DPU by the DPU itself. For example, the DPU may add to its jobs queue 812, a child process of another (parent) process already assigned to the DPU, or a child process of a parent process running on another DPU.

In some embodiments, a jobs queue 812 also indicates the status of a respective process listed in the queue. For example, as shown in FIG. 8, a status of "Process 1F" is listed as "Done," while a status of "Process 7E" is listed as "Working". In some embodiments a status is simply a binary flag indicating completion or not, while in some embodiments it is more qualitative. For example, "Process 7E" is listed as "Working" (e.g., in progress, pending, incomplete, in process), while "Process 9B" is listed as "Waiting" (i.e., instructions for Process 9B have not been started at DPU 38A yet).

Figure 9:
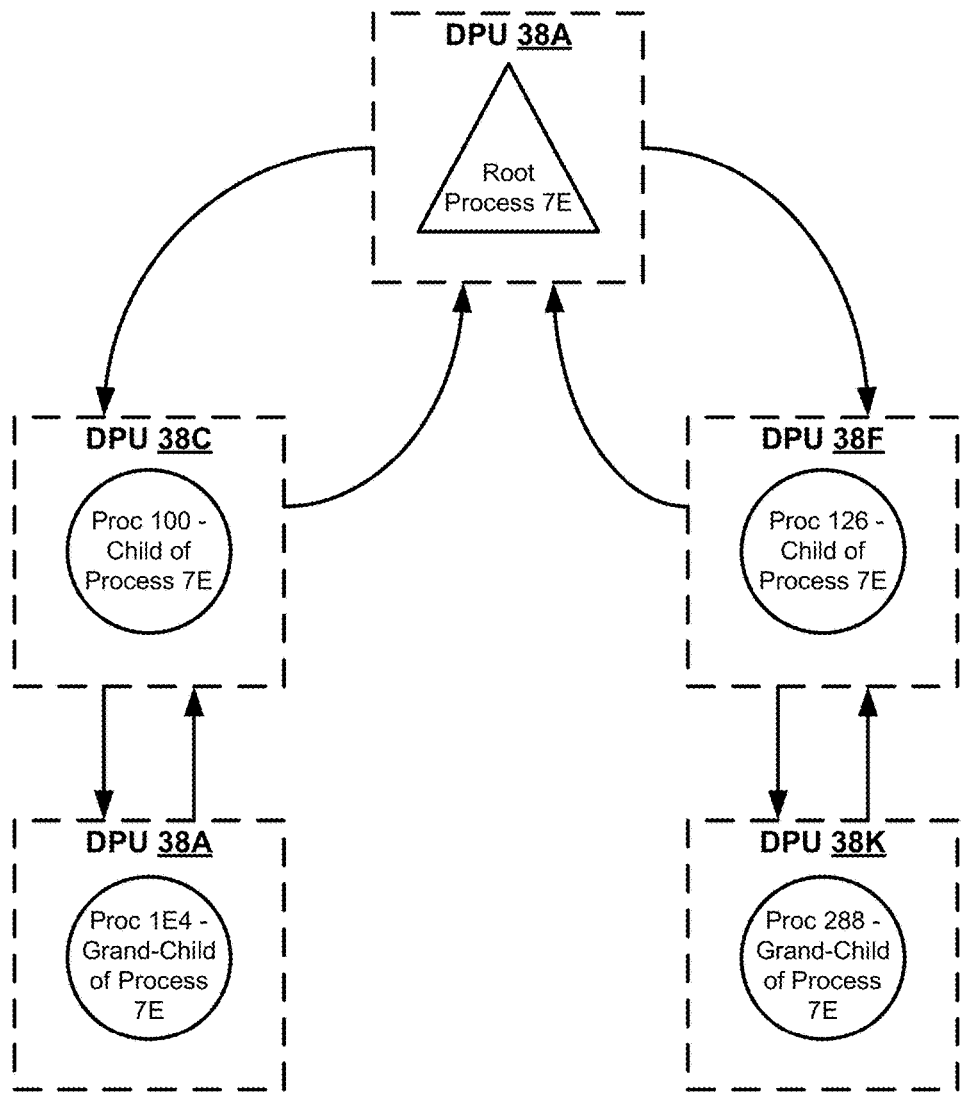
FIG. 9 is a block diagram of an example hierarchy of related processes amongst data processing units according to one or more embodiments.

FIG. 9 is a block diagram of an example hierarchy of related processes amongst data processing units according to one or more embodiments. As illustrated in FIG. 9, a plurality of DPUs (e.g., connected by a DPU interconnection network), may execute related processes and communicate instructions and results associated with these related processes amongst each other. In some embodiments, the highest level of a hierarchy of processes is a root process. A root process may be running at any DPU of a set of interconnected DPUs. A root process in this context may be a core, top-level process of an operating system. In some embodiments, a set of interconnected DPUs has more than one root process in execution at the same time. As described throughout the present disclosure, a plurality of DPUs may operate in a computing system in the absence of (e.g. without) a central processing unit (CPU) or another processing unit, device or block managing all the processes and/or operations of the entire computing system.

As shown in FIG. 9, an example root process 7E is running at DPU 38A. Derived from this root process 7E are two child processes, child process 100 running at DPU 38C and child process 126 running at DPU 38F. Although in this example the child processes of root process 7E are running at different DPUs, in some embodiments a plurality of child processes of the root process may be executed by a single DPU. For example, if a set of DPUs comprises ten DPUs but there are twelve child processes of the root process, one or more DPUs may host more than one child process of the root process. Each of the child processes is shown to have a grand-child process (relative to the root process). For example, grand-child process 1E4 is derived from child process 100 and operating at DPU 38A while grand-child process 288 is derived from child process 126 and operating at DPU 38K. This example illustrates that in some embodiments, a derivative process of a root process may be executed at the same DPU as the one executing the root process. While not shown in FIG. 9, one skilled in the art will recognize that further generations of processes can be derived from the root process, and many more processes can be derived and executed in parallel at the child and grand-child level as well. In some embodiments a root process is selected to run on a data processing unit on the basis of resource availability (e.g., on a minimally loaded device/DPU).

Figure 10:
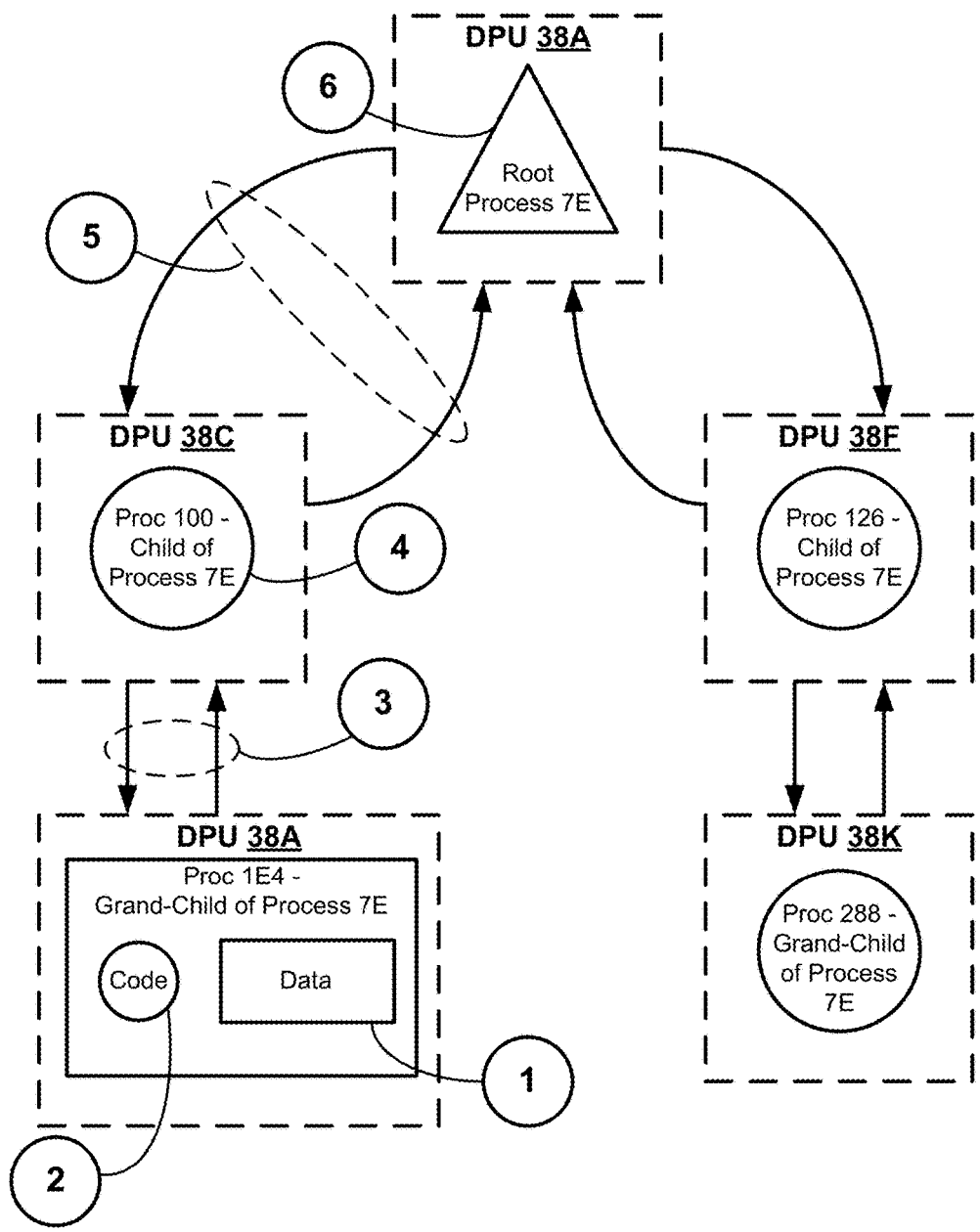
FIG. 10 is a block diagram illustrating sources of data and/or process corruptions within an example hierarchy of related processes amongst data processing units according to one or more embodiments.

FIG. 10 is a block diagram illustrating sources of data and/or process corruptions within an example hierarchy of related processes amongst data processing units according to one or more embodiments. FIG. 10 illustrates the same hierarchy of processes as shown in FIG. 9 and described above. A first type of corruption in the hierarchy of processes, as represented by indicator 1, is corruption of data (e.g., user data) in a process. While the example shows corruption of data in a grand-child process, this problem could occur in any process of the hierarchy. A second, and similar, type of corruption in the hierarchy of processes, as represented by indicator 2, is corruption of code or executable information in a process. Similarly, while the example shows corruption of code in a grand-child process, this problem could occur in any process of the hierarchy. These two forms of corruption may exist at the location where the data and/or executable code reside in non-volatile memory, and/or in an instruction set corresponding to the process (e.g., pointers to the data and/or executable code residing in memory).

A third type of corruption in the hierarchy of processes, as represented by indicator 3, is corruption or failure of status knowledge about a child (or grand-child) process. For example, if DPU 38A crashed and restarted or somehow went offline, child process 100 at DPU 38C would lose status knowledge of grand-child process 1E4 as DPU 38A would cease to execute grand-child process 1E4 and would therefore fail to report a result or a status regarding grand-child process 1E4 to DPU 38C. This example may also cause the root process to cease to function, illustrating a general objective to select distinct data processing units for executing derivative processes of a root process whenever possible. In some embodiments, corruption of knowledge of a child process is a temporary or localized event. In some embodiments, the DPU hosting the child process may restart and communicate to one or more DPUs above it in the hierarchy about its status. In another example, the DPU hosting the child process may experience a processing issue affecting only the child process, and therefore still be responsive to other DPUs with respect to other processes running on the DPU. In some embodiments a DPU hosting the child process may experience a communication issue preventing it from communicating a status or result to another DPU, rather than a computing or processing issue preventing it from generating a status or result.

A fourth type of corruption in the hierarchy of processes, as represented by indicator 4, is corruption of a child process. As explained above with respect to possible corruption of code and/or data at the grand-child process level, these types of failures can occur in any level of hierarchy. A fifth type of corruption in the hierarchy is corruption of knowledge of the child process, as represented by indicator 5 and explained above with respect to corruption of status knowledge of the grand-child process. A sixth type of corruption in the hierarchy, as represented by indicator 6, is corruption of the root process. As explained above with respect to failures at the child and grand-child process level, a corruption at the root process level could be based on a problem with code or data contained in the process itself, or an issue with the DPU hosting the process (e.g., system-wide crash, going offline).

Allocation Table

Figure 11:
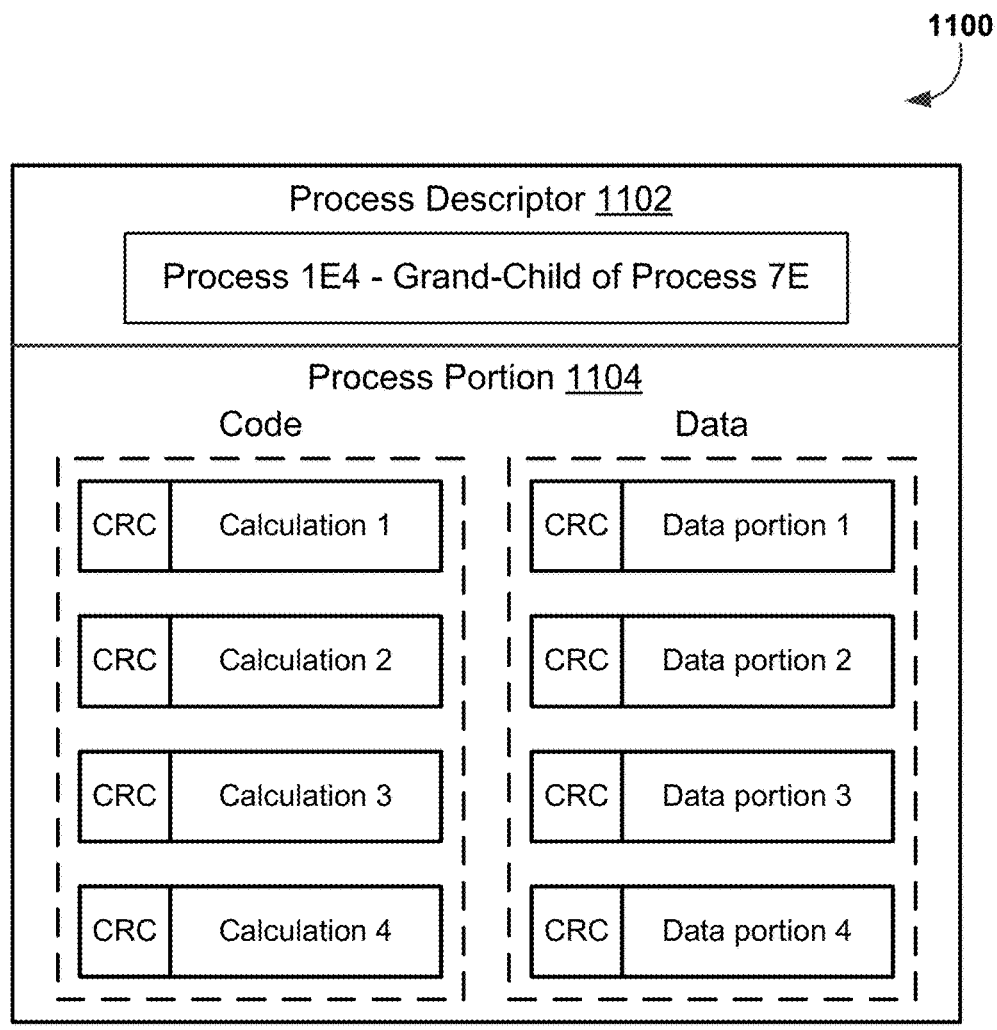
FIG. 11 is a block diagram illustrating example content of a process according to one or more embodiments.

FIG. 11 is a block diagram illustrating example content of an encapsulated process 1100 according to one or more embodiments. In some embodiments, the contents of encapsulated process 1100 are stored in non-volatile storage memory of the data processing unit that was assigned to execute this process. For example, the encapsulated process 1100 corresponds to grand-child process 1E4 from FIGS. 9 and 10, which was assigned to be executed by DPU 38A. In some embodiments, a encapsulated process 1100 includes a process descriptor 1102 and a process portion 1104. A process descriptor 1102 may serve as metadata and/or include identifying information for encapsulated process 1100. For example, process descriptor 1102 may indicate one or more of a relative process identifier (e.g., Process 1), a globally unique identifier (e.g., Process 1E4), a DPU that assigned this process to the host DPU that executed this process (e.g., DPU 38C), and a relationship to the corresponding root process (e.g., grand-child process). In some embodiments, the process descriptor is referred to as a process signature, while in some embodiments the process descriptor is a set of information that includes a process signature. In some embodiments a process signature is data that indicates the presence and/or identity of corresponding process data within non-volatile storage of a data processing unit.

As shown in FIG. 11, a process portion 1104 of encapsulated process 1100 may include one or more lines of code, calculations and/or executable data, and one or more lines of data. In some embodiments a respective line of code corresponds to a respective line of data. In some embodiments, a respective line of code and/or a respective line of data has a header with CRC information to allow for a validity check of the corresponding line of code and/or line of data.

Figure 12:
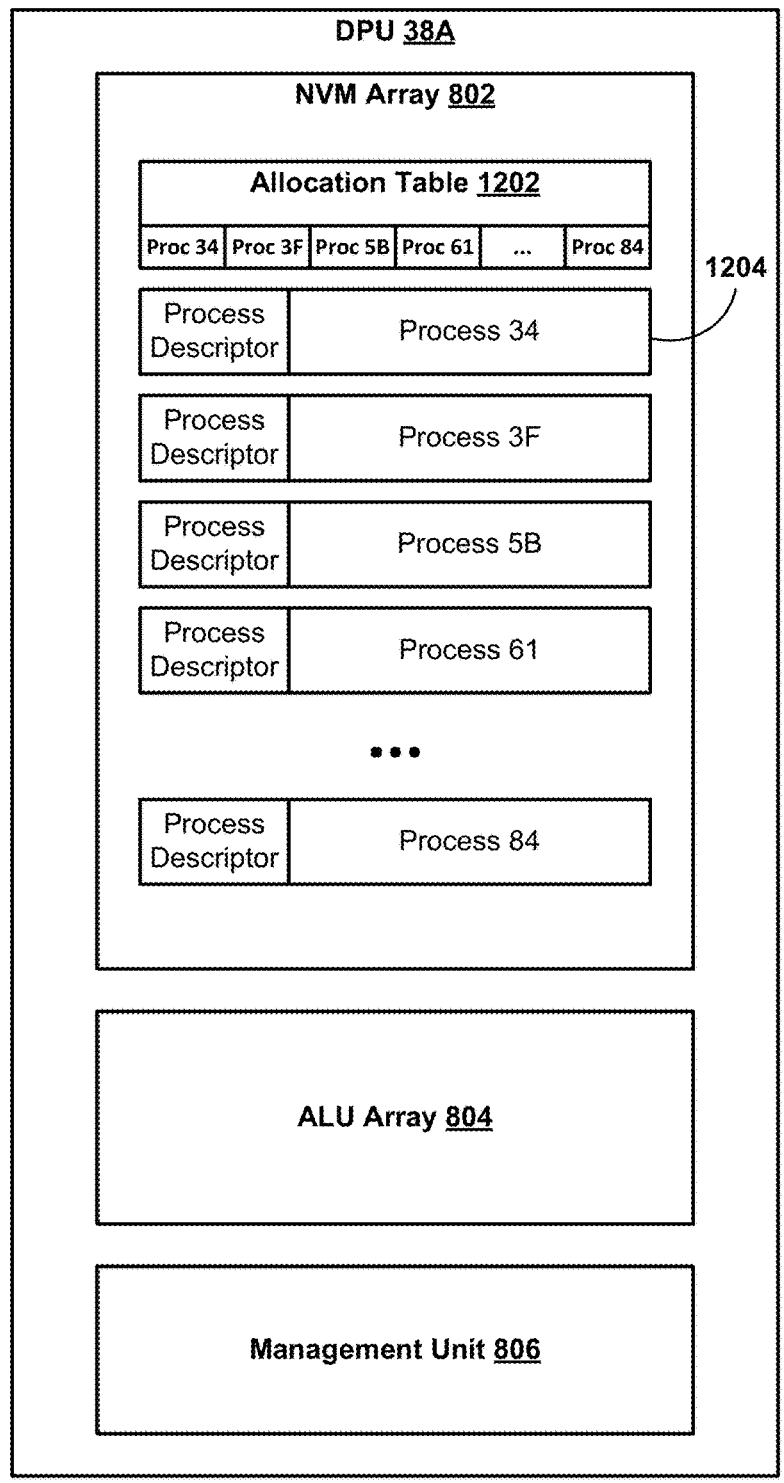
FIG. 12 is a block diagram illustrating an example allocation table for results of processes according to one or more embodiments.

FIG. 12 is a block diagram illustrating an example allocation table 1202 for results of processes according to one or more embodiments. A computer architecture with a distributed network of data processing units, each associated with a non-volatile memory array, may rely on local allocation tables each corresponding to a respective non-volatile memory array. In some embodiments, an allocation table 1202 resides in the NVM array 802 of a respective DPU (e.g., DPU 38A as shown). An allocation table 1202 may be used to retrieve results of one or more processes stored in the NVM array 802 of the DPU. In some embodiments, an allocation table 1202 includes identifiable information for one or more processes and corresponding links, pointers or process descriptors to an encapsulated process, which may include executable code, data and/or the results of a respective process corresponding to the executable code and data. In some embodiments, an encapsulated process 1204, as described with respect to FIG. 11, includes a block of information (e.g., one or more memory pages) in NVM array 802 corresponding to a process that has been executed at the DPU or will be executed at the DPU in which it resides (e.g., DPU 38A in this example). An encapsulated process 1204 may comprise user data, code data, identifying information about the process and/or a process descriptor to identify the encapsulated process and identify that this block of data is occupied by an encapsulated process 1204, in particular. In some embodiments, an encapsulated process 1204 is represented in NVM array 802 as a file. An encapsulated process 1204 may be stored in NVM array 802 as a persistent process, and may be accessible to several applications in a network of DPUs.

Figure 13:
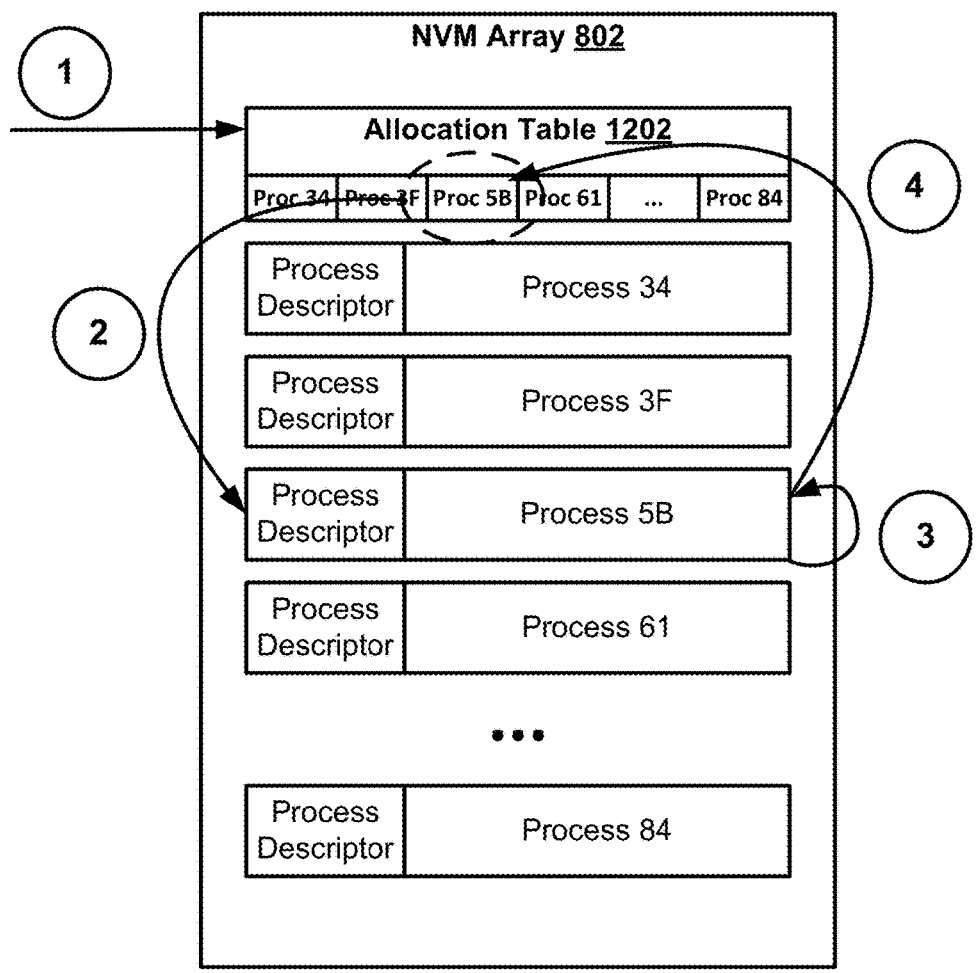
FIG. 13 is a block diagram illustrating a method of maintaining data in an allocation table according to one or more embodiments.

FIG. 13 is a block diagram illustrating a method of maintaining data in an allocation table 1202 according to one or more embodiments. In some embodiments, an allocation table 1202 is first checked or assessed for validity, as represented by event 1. For example, allocation table 1202 may be checked for validity on the basis of correspondence to a checksum value or some other error-detecting codes. If the allocation table 1202 is found to be valid, each process descriptor stored in the allocation table 1202 is retrieved, accessed, read or found from the table using one or more of any search technique known to those of ordinary skill in the art, and used to locate the stored, encapsulated process in the NVM array 802. For example, the process descriptor corresponding to an encapsulated process 5B is retrieved from the allocation table, and the process descriptor is used to find the encapsulated process in the NVM array 802, as represented by event 2.

In some embodiments, an encapsulated process is retrieved, accessed, read or found from NVM array 802, then checked for corruption (e.g., using one or more known error-detection techniques), as represented by event 3. If the encapsulated process is determined to have a corruption, an attempt is made to recover some or all of the data of the encapsulated process. In some embodiments, the encapsulated process has code data and user data, and recovering the data includes recovering the code data based on data-recovery techniques and recoverable information corresponding to the code data (e.g., using ECC) and/or recovering the user data based on techniques and recoverable information corresponding to the user data (e.g., using ECC). Whether or not the encapsulated process data is initially valid, recovered, or not recovered, this status of the encapsulated process data in NVM array 802 is returned to allocation table 1202, as represented by event 4. Allocation table 1202 is then updated by removing a process descriptor pointing to the corrupted encapsulated process, or is maintained with the process descriptor pointing to the valid encapsulated process.

In some embodiments, a particular process descriptor may be removed from allocation table 1202 for another reason, such as in response to receiving a request, suggestion or permission from another DPU to de-allocate memory reserved for the corresponding encapsulated process, or detection of a related parent process experiencing a failure and no longer needing the results of the particular encapsulated process corresponding to the particular process descriptor. In some embodiments, a management unit of a DPU performs the tasks of checking the validity of the allocation table 1202, retrieving one or more process descriptors from the allocation table 1202, finding them in memory, checking the validity of the corresponding encapsulated processes and updating the allocation table 1202.

Figure 14:
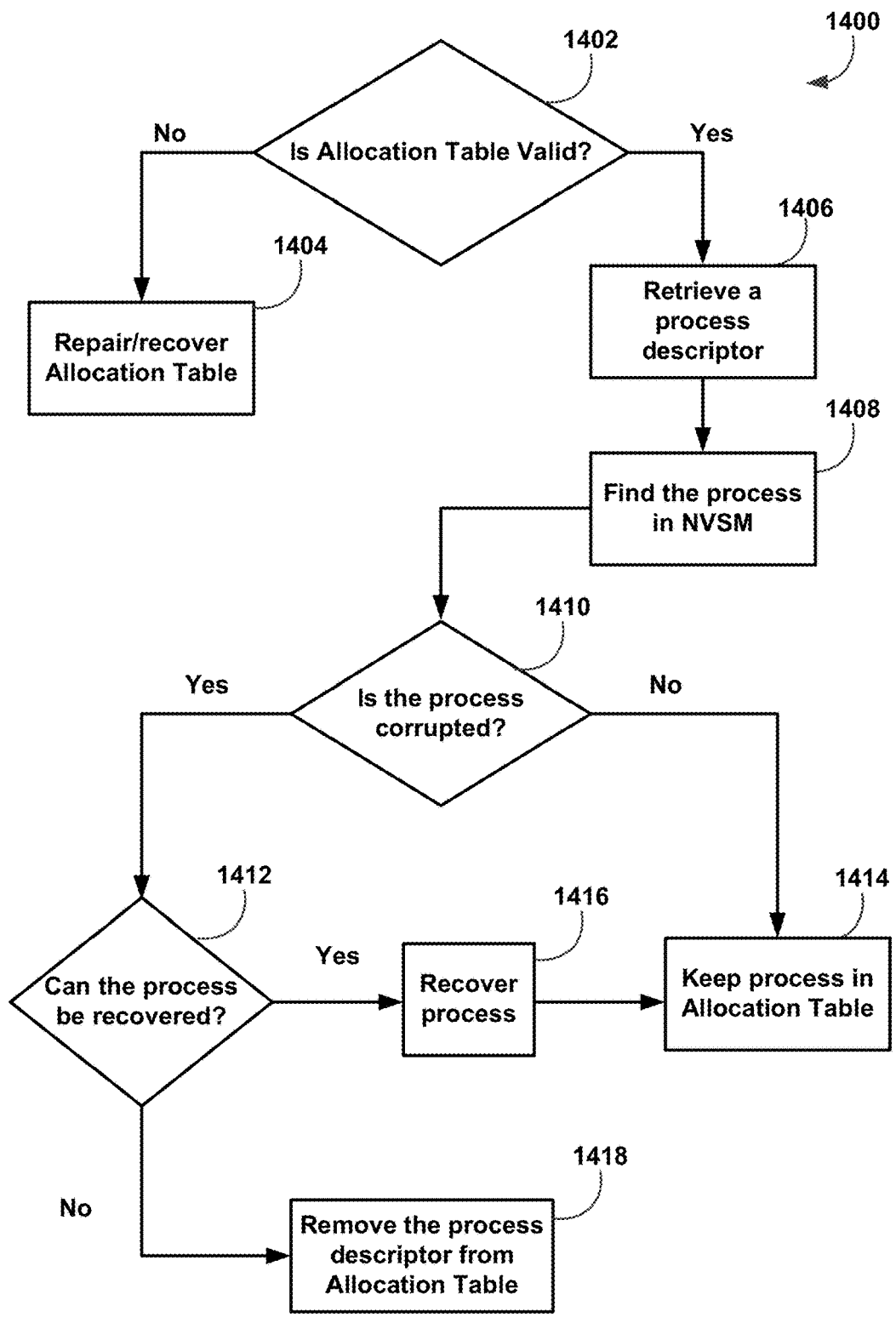
FIG. 14 is a flow diagram illustrating a method for maintaining data in an allocation table according to one or more embodiments.

FIG. 14 is a flow diagram illustrating a method 1400 for maintaining data in an allocation table according to one or more embodiments. Block 1402 of method 1400 illustrates a decision to assess or determine if the allocation table (e.g., allocation table 1202 of FIG. 13) is valid. In some embodiments validity of the allocation table is based on one or more error detection techniques such as using a corresponding checksum value against the contents of the allocation table.

If the allocation table is not valid, method 1400 includes repairing and/or recovering the allocation table, as represented by block 1404 and described in detail below. If the allocation table is valid, a process descriptor is retrieved, accessed, read or found from the allocation table, as represented by block 1406. With the retrieved process descriptor, the encapsulated process may be found in the non-volatile memory storage of the DPU, as represented by block 1408. After an encapsulated process is found in the non-volatile memory array, a decision must be made to determine if the data of the encapsulated process is corrupted (e.g., invalid, incomplete, overwritten etc.) or not, as represented by block 1410. If the encapsulated process is not corrupted, block 1414 illustrates that the corresponding process descriptor is kept in the allocation table.

If the encapsulated process is corrupted, a decision, represented by block 1412 is made to determine if the encapsulated process can be recovered or not. In accordance with a determination that the encapsulated process data cannot be recovered, the corresponding process descriptor is removed from the allocation table, as represented by block 1418. In some embodiments, removing a process descriptor from the allocation table effectively increases the free space of the NVM memory of the DPU. If the data of the encapsulated process can be recovered, the data is recovered as shown by block 1416. If the encapsulated process data is recovered, the corresponding process descriptor is kept in the allocation table, as shown by block 1414.

Figure 15:
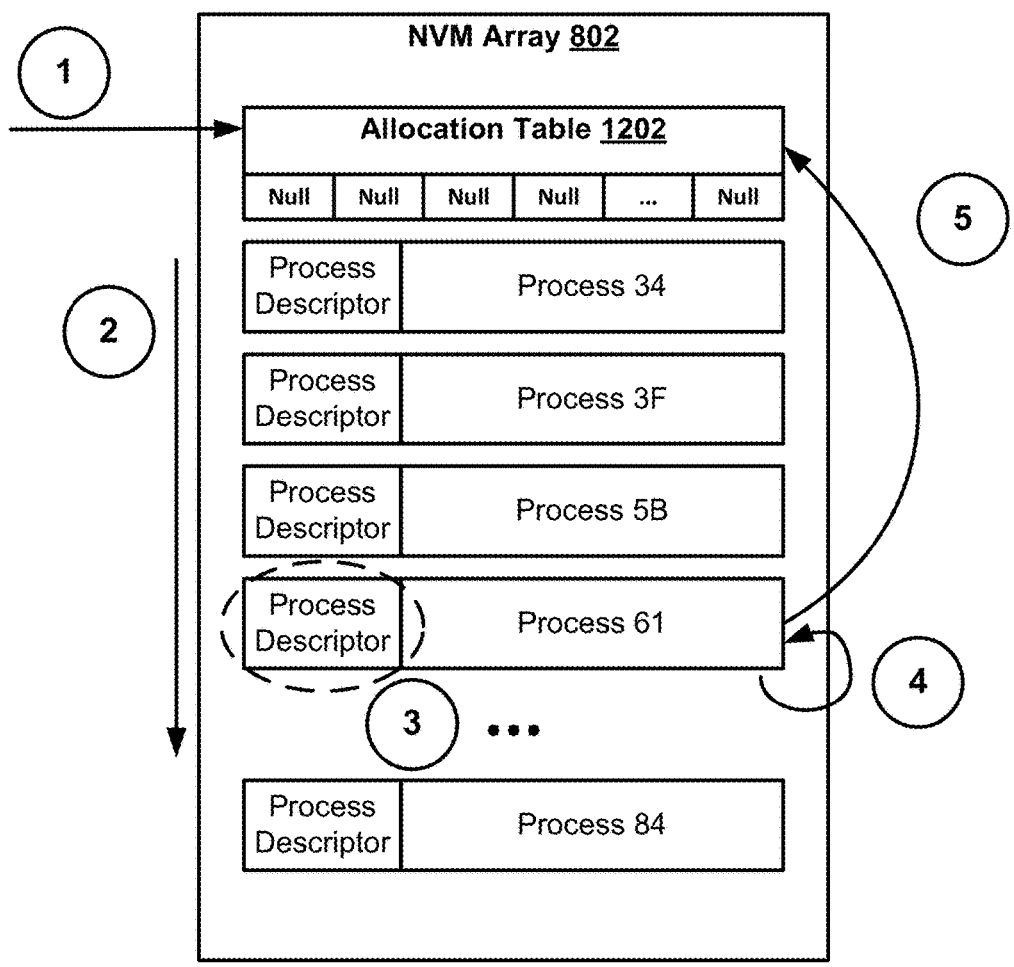
FIG. 15 is block diagram illustrating a method of restoring an allocation table according to one or more embodiments.

FIG. 15 is block diagram illustrating a method of restoring an allocation table according to one or more embodiments. As shown in FIG. 15, in some embodiments, an allocation table 1202 is checked and determined to be corrupt, invalid or otherwise compromised, as represented by event 1. In accordance with a determination that the allocation table 1202 is corrupt, a new allocation table may be generated or the existing one may be wiped clean.

In some embodiments, one or more process descriptors, markers or signatures are stored in the metadata of each encapsulated process. In some embodiments, the contents of the entire NVM array are scanned to find such process descriptors, markers or signatures to identify any encapsulated process data stored in NVM storage. This is represented by event 2.

In the event a block of data (e.g., one or more memory pages) corresponding to an encapsulated process is found, as represented by event 3, the data of the encapsulated process is checked or assessed for validity or corruption (e.g., using one or more known error-detection techniques). If the encapsulated process is determined to have a corruption, an attempt is made to recover some or all of the data of the encapsulated process, as represented by event 4. In some embodiments, the encapsulated process has code data and/or user data, and recovering the data includes recovering the code data based on techniques and recoverable information corresponding to the code data (e.g., using ECC) and/or recovering the user data based on techniques and recoverable information corresponding to the user data (e.g., using ECC). If encapsulated process data is valid or recovered, identifiable information, such as a process descriptor, memory location and/or process ID of the encapsulated process data in NVM array 802 is added to allocation table 1202, as represented by event 5. Allocation table 1202 is then rebuilt with subsequent process descriptors pointing to valid encapsulated processes in the NVM array 802.

In some embodiments, validity of an encapsulated process listed in allocation table 1202 is further assessed on the basis of a status of a related parent process. For example, in FIG. 15, the data corresponding to process 61 passes a checksum check, and may therefore be added to allocation table 1202. In the case of an additional validity check, the process descriptor for encapsulated process 61 may indicate that process 61 was a child of process 10 at DPU 38B. As NVM array 802 and allocation table 1202 reside at DPU 38A, DPU 38A (or its management unit) may communicate with DPU 38B to find out if the parent process, process 10, is still valid, and/or if there is still a need to store the results of child process 61 in NVM array 802 of DPU 38A.

Figure 16:
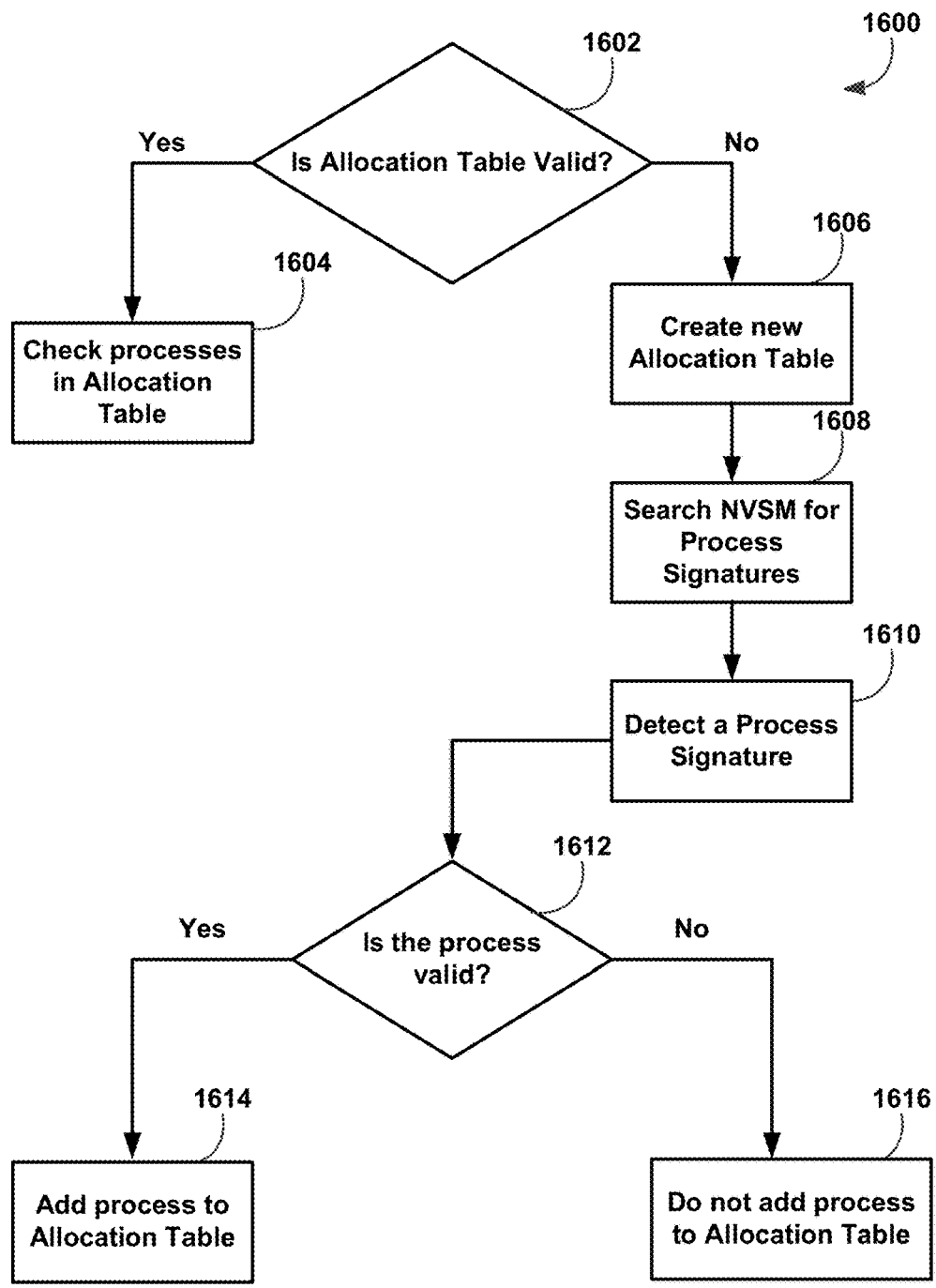
FIG. 16 is a flow diagram illustrating a method of restoring an allocation table according to one or more embodiments.

FIG. 16 is a flow diagram illustrating a method 1600 of restoring an allocation table according to one or more embodiments. In some embodiments, method 1600 is an extension of method 1400 described above with respect to FIG. 14. Block 1602 of method 1600 illustrates a decision to assess or determine if the allocation table (e.g., allocation table 1202 of FIG. 15) is valid. In some embodiments validity of the allocation table is based on one or more error detection techniques such as comparing a corresponding checksum value against the contents of the allocation table.

If the allocation table is valid (e.g., Yes), method 1600 includes checking the entries corresponding to encapsulated processes listed in the allocation table, as described above with respect to FIGS. 13 and 14 and represented by block 1604. If the allocation table is not valid (e.g., No), a new allocation table is created, or the old allocation table is cleared (e.g., wiped clean, reset, emptied of contents), as represented by block 1606. In some embodiments a portion of non-volatile memory in a data processing unit is reserved for writing one or more allocation tables. In some embodiments a secondary or backup allocation table is maintained at the same data processing unit or at another data processing unit. In some embodiments, if there is a secondary allocation table, that secondary allocation table is used as a basis for developing a new allocation table.

Method 1600 continues with searching and/or parsing the non-volatile memory of the data processing unit for one or more process identifiers, such as a process signature, marker or descriptor, as represented by block 1608. In some embodiments, searching is performed for a particular type of data (e.g., a process signature), rather than particular process-identifying data (e.g., a specific process descriptor). A process signature may be detected, as represented by block 1610. In some embodiments, a process signature is the same for all blocks of data corresponding to an encapsulated process. In some embodiments, a process signature is unique for each block (e.g., memory page) of data corresponding to an encapsulated process. In some embodiments, a process descriptor is unique for each block of data corresponding to an encapsulated process.

After an encapsulated process corresponding to the detected process signature is found in the non-volatile memory array, a decision must be made to determine if the data of the encapsulated process is valid (e.g., passes checksum, not corrupt, complete, not overwritten, not abandoned etc.), as represented by block 1612. For example, determining the validity of the encapsulated process data may include determining that another process that requested this process data still needs it. Alternatively, this may include determining validity of the process data on the basis of time since it was written to memory, or specific location within the memory (e.g., within a garbage collection portion of memory). If the encapsulated process is valid, block 1614 illustrates that the corresponding process descriptor is added to the new allocation table. If the encapsulated process is not valid, block 1616 illustrates that the corresponding process descriptor is not added to the new allocation table, and therefore that portion of non-volatile memory may be overwritten.

Additional validity checks may be performed on the encapsulated process data corresponding to the detected process signature. For example, an encapsulated process may have corresponding identifying information about a parent process. A validity check may include determining if the parent process of the completed child process is still alive, active or otherwise in need of this completed child process data. If it is not in need of this completed child process data, the completed child process descriptor may not be added to the new allocation table.

Restoring Processes at DPUs

Figure 17:
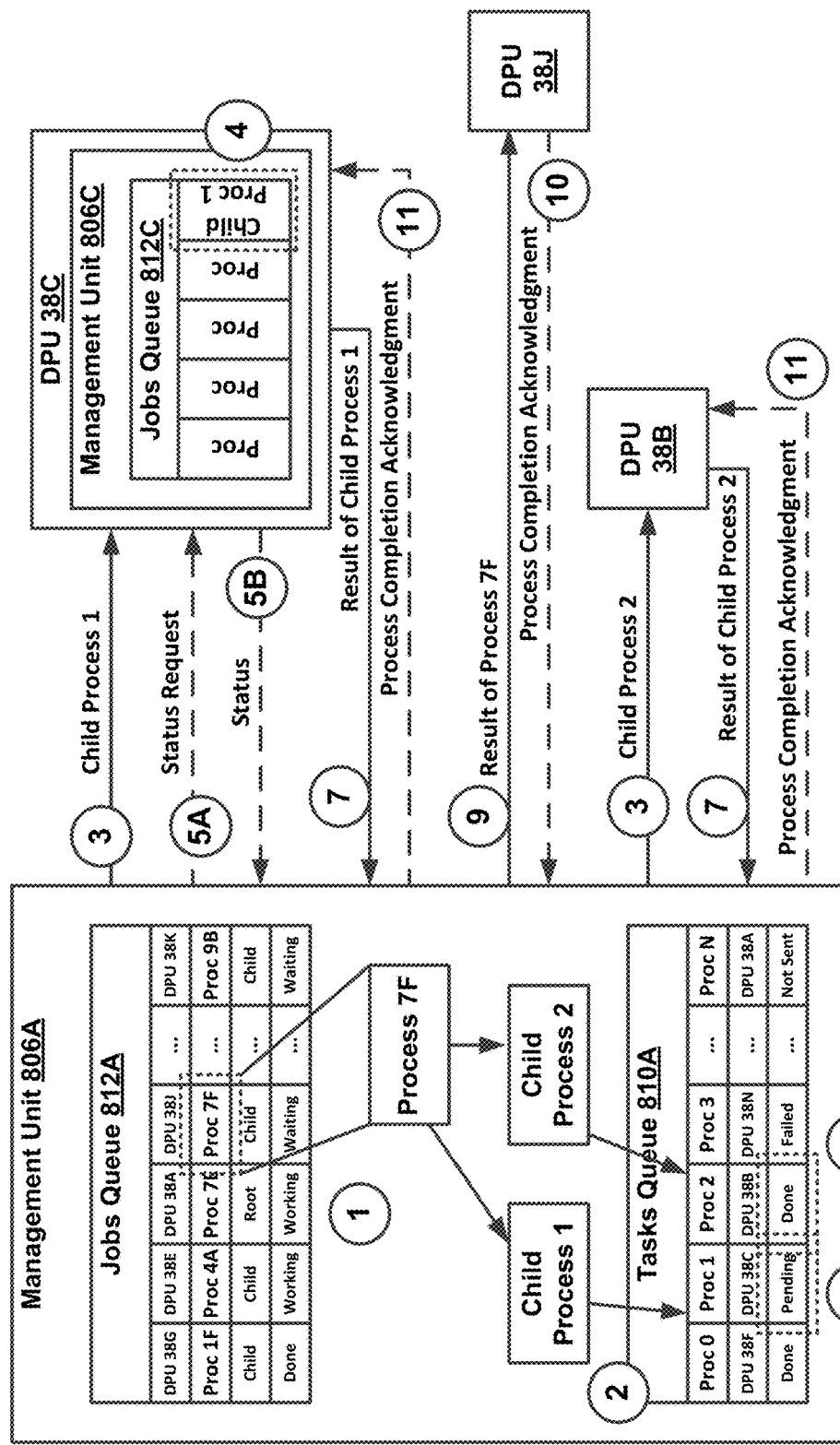
FIG. 17 is a block diagram illustrating a method of executing parent and child processes according to one or more embodiments.

FIG. 17 is a block diagram illustrating a method of executing parent and child processes according to one or more embodiments. As described above, a first data processing unit (e.g., DPU 38A) may have a management unit 806A, comprising an jobs queue 812A of processes queued for completion at the first data processing unit and a tasks queue 810A of child processes queued for assignment to one or more data processing units of a network of data processing units including the first data processing unit. In some embodiments, the child processes of tasks queue 810A are children of one or more processes assigned to the first DPU in jobs queue 812A.

For example, as represented by event 1 in FIG. 17, a process descriptor corresponding to a process (e.g., an encapsulated process stored in NVM memory of a DPU), Process 7F, is retrieved, read or accessed from jobs queue 812A. In some embodiments, an assessment is made (e.g., by management unit 806A) as to whether or not a respective process listed (e.g., by its process descriptor) in jobs queue 812A necessitates creation of one or more corresponding child processes. Additionally, such assessment may include determining how many child processes to spawn from this respective process. In this example, instructions corresponding to two child processes to be performed at respective DPUs, are generated off of parent process, Process 7F, and process descriptors corresponding to the two child processes are added to the tasks queue 810A, as represented by event 2. Adding a process descriptor corresponding to a child process to the tasks queue 810A may include assigning the child process to a particular DPU of a network or plurality of DPUs in association with the first DPU. Determining an assignment of a DPU for executing a respective child process may be performed in accordance with one or more assignment criteria. For example, the first DPU may assign a child process to a second DPU on the basis of relative computational load of one or more DPUs of the network, or frequency of assignments to the second DPU from the first DPU, or relative communication latency with the second DPU. In some embodiments, the second DPU may be the first DPU.

The two generated sets of instructions corresponding to child processes are labeled in this example as Child Process 1, assigned to DPU 38C and Child Process 2, assigned to DPU 38B. In this example, instructions for each of the two child processes are transmitted to their respectively assigned DPUs, as represented by event 3. In some embodiments, executable code, data, and/or instructions corresponding to a child process may already be present (e.g., stored in NVM memory) at an assigned DPU. At DPU 38C, for example, a process descriptor (or another form of identifier or pointer) corresponding to the instructions for Child Process 1 are added to the jobs queue 812C of management unit 806C of DPU 38C, as represented by event 4. The assigned DPU (e.g., DPU 38C) may send a message or status update to the parent or assigning DPU (e.g., DPU 38A) to confirm addition of a process descriptor corresponding to the child process in its jobs queue. In some embodiments, the first DPU (e.g., DPU 38A), may send a status request to the DPU assigned to execute a respective child process, as represented by event 5A. In the event such a status request is made, the DPU assigned to execute the respective child process (e.g., DPU 38C) may respond with status information about processing the respective child process, as represented by event 5B. The first DPU may use this status information to update status information corresponding to the respective child process in its tasks queue 810A or to the corresponding parent process in its jobs queue 812A (e.g., in progress, pending, incomplete, processing). In some embodiments, the first DPU may update status information about either the child or parent process in another similar table for recording and updating the status of respective processes. This updating of status information is represented by event 6.

Alternatively to sending a status response, or additionally, the DPU corresponding to execution of a respective child process may return the result of the child process, as represented by event 7 at DPU 38C and DPU 38B of the example shown in FIG. 17. In some embodiments, a DPU that executed instructions corresponding to a respective child process sends information to allow the first DPU to retrieve the results of the child process, in addition to or instead of the actual results. For example, the results of the completed child process may be stored as described above with respect to FIGS. 11-16, in non-volatile memory of the DPU that executed instructions corresponding to the respective child process. In some embodiments, the first DPU may update status information corresponding to the respective child process in its tasks queue 810A or to the corresponding parent process in its jobs queue 812A (e.g., completed, done, OK). In some embodiments, the first DPU may update status information about either the child or parent process in another similar table for recording and updating the status of respective processes. This updating of status information is represented by event 8.

Additionally, after all child process results corresponding to a parent process have been received by the first DPU, the first DPU may use the results to complete processing of the parent process (e.g., Process 7F). The results of the completed parent process may then be transmitted by the first DPU to a DPU that assigned the parent process to the first DPU for execution, as represented by event 9. In this example, Process 7F was assigned to DPU 38A by DPU 38J for completion.

In some embodiments, a DPU receiving results of a process (e.g., DPU 38J) may return a process completion acknowledgment message to the DPU sending the results, as represented by event 10. In some embodiments, in response to receiving this process completion acknowledgement message, a DPU de-allocates space corresponding to the completed process in its non-volatile memory. Alternatively, in response to receiving this process completion acknowledgement message, a DPU may retain the data corresponding to the completed process in its non-volatile memory. For example, DPU 38A receives a process completion acknowledgment message from DPU 38J, and therefore retains the completed process data corresponding to Process 7F in its non-volatile memory array. In some embodiments, receipt of a process completion acknowledgement message from a DPU requesting performance of a parent process (e.g., Process 7F), triggers generation and transmission of one or more process completion acknowledgment messages to DPUs that executed related child processes (e.g., Child Process 1 and 2). In this example, the first DPU 38A, sends a process completion acknowledgment message to DPU 38C and to DPU 38B, as represented by event 11.

The example described above with respect to sending and receiving process completion acknowledgment messages would require a chain of process completion messages to trickle down from the highest level of process hierarchy corresponding to a series of processes. For example, a DPU executing a root process would send a process completion acknowledgment, which would trigger generation and receipt of subsequent process completion acknowledgment messages at data processing units that executed derivative processes of the root process.

Alternatively, a first DPU may generate and send a process completion acknowledgment message directly to a second DPU in response to receiving a result from the second DPU. In this example, DPU 38A may receive the result of Child Process 1 from DPU 38C, and at some point before receiving a process completion acknowledgment at DPU 38A from DPU 38J, DPU 38A may transmit a process completion acknowledgment message to DPU 38C.

Figure 18:
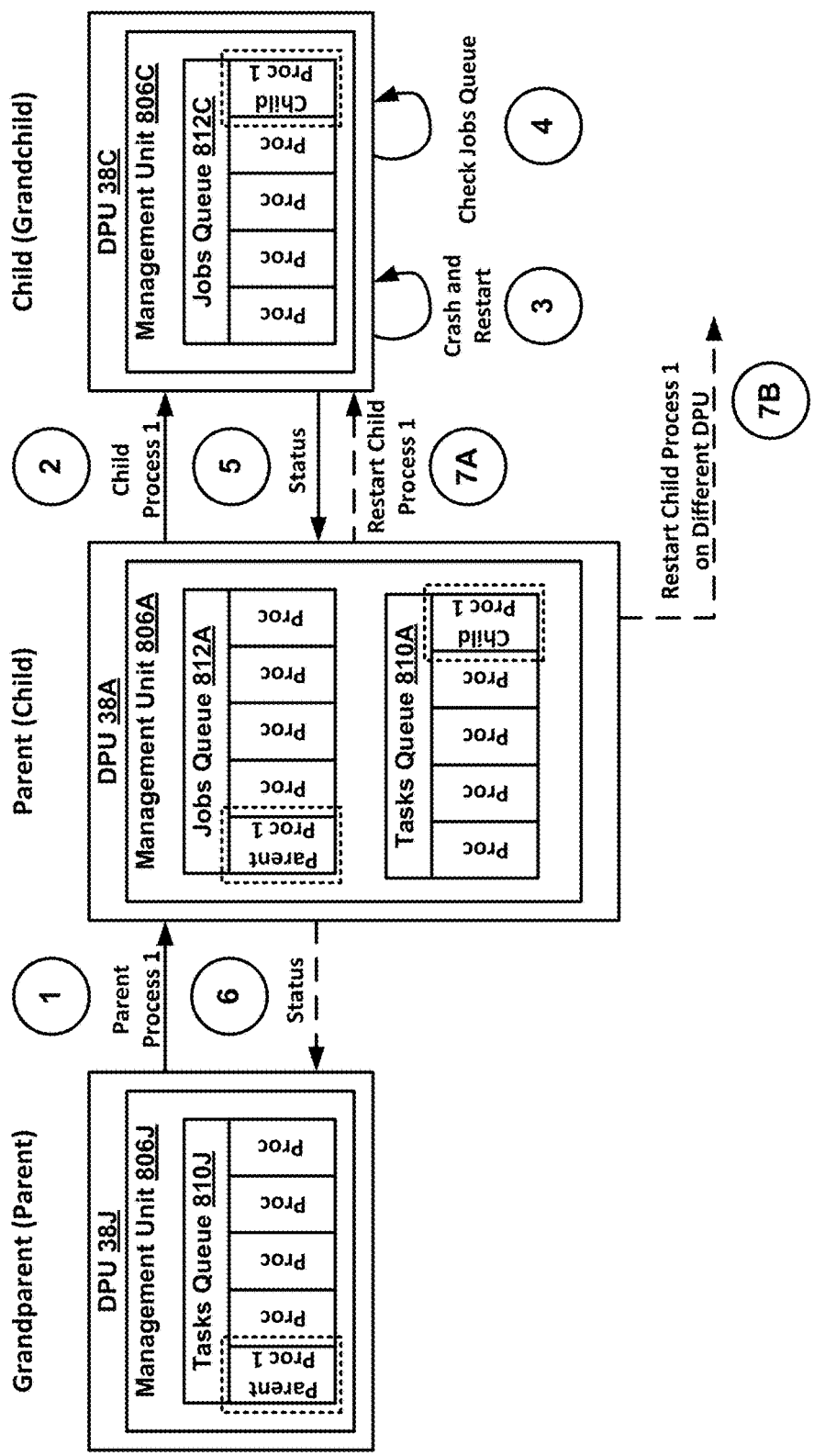
FIG. 18 is a block diagram illustrating a method of responding to a failure to execute a child process according to one or more embodiments.

FIG. 18 is a block diagram illustrating a method of responding to a failure to execute a child process according to one or more embodiments. While FIG. 17 illustrated an example of ideal execution of one or more parent processes and/or child processes, in some cases a problem may occur at one or more data processing units involved in the execution of one or more processes in a hierarchy of processes. For example, a data processing unit may experience a system-wide crash, may run out of processing resources or may run out of valid non-volatile memory space for writing results of a completed operation. While FIGS. 18, 20 and 22 describe a processing failure at a respective DPU caused by a crash and restart of the DPU, one skilled in the art will understand that this is one example of a cause of incomplete process execution.

FIG. 18 illustrates a first data processing unit (DPU 38A), referred to as a parent DPU in this context, a second data processing unit (DPU 38J) referred to as a grandparent DPU in this context, as well as a third data processing unit (DPU 38C) referred to as a child DPU in this context. From the perspective of the top-most DPU in this described chain of associated data processing units, the grandparent DPU may optionally be referred to as a parent DPU, the above-named parent DPU may optionally be referred to as a child DPU and the above-named child DPU may optionally be referred to as a grandchild DPU.

In some embodiments, a top-level process, referred to in this example as a parent process, is listed in a tasks queue of a respective data processing unit. FIG. 18 shows Parent Process 1 listed in tasks queue 810J of management unit 806J of DPU 38J, for assignment to a data processing unit of the same network as DPU 38J. In some embodiments, Parent Process 1 is a derivative process of a corresponding process in the jobs queue of DPU 38J. Instructions corresponding to Parent Process 1 are transmitted from the grandparent DPU to the parent DPU, as represented by event 1. In some embodiments, executable code, data, and/or instructions corresponding to a process may already be present (e.g., stored in NVM memory) at an assigned DPU.

As explained above with respect to FIG. 17, the parent DPU, DPU 38A, places a process descriptor corresponding to assigned Parent Process 1 in its jobs queue 812A of its management unit 806A. In this example, the parent DPU makes a determination to generate instructions for at least one derivative process corresponding to Parent Process 1, namely Child Process 1. The parent DPU places a process descriptor corresponding to Child Process 1 in its tasks queue 810A and assigns this derivative process to the child DPU, DPU 38C. The parent DPU transmits instructions corresponding to Child Process 1 to the grandchild DPU, as represented by event 2. In some embodiments, executable code, data, and/or instructions corresponding to a process may already be present (e.g., stored in NVM memory) at an assigned DPU.

The child DPU, DPU 38C, places the instructions corresponding to the Child Process 1 in its NVM memory, and a process descriptor corresponding to Child Process 1 into jobs queue 812C of its management unit 806C. In some embodiments, a data processing unit (e.g., DPU 38C) assigned to execute a respective child process (e.g., Child Process 1), experiences a problem with executing the respective child process. In this example, the child DPU, DPU 38C experiences a system-wide crash and subsequent restart, as represented by event 3. In some embodiments, a system-wide crash results in an emptying of the contents of the jobs queue of the child DPU, including the process descriptor corresponding to the respective child process. In some embodiments, a system-wide crash does not result in an emptying of the contents of the jobs queue of the child DPU, including the instructions corresponding to the respective child process. Nonetheless, after restarting (or otherwise resolving the processing issue), the child DPU checks its jobs queue, as represented by event 4.

In some embodiments, the child DPU sends a respective status of a respective process in its jobs queue to a respective assigning DPU. For example, DPU 38C sends a status message to DPU 38A about Child Process 1. In some embodiments, the status information is sent in response to a request from the parent DPU. In some embodiments, the processing problem (e.g., system-wide crash) occurred while the respective child process was being processed. In this case, the instructions corresponding to the child process may be corrupt and/or lost, and the child DPU would need the instructions sent again in order to complete execution of the child process. In some embodiments, the processing problem occurred before processing the child process, and the instructions corresponding to the child process are still valid and able to be executed at the child DPU. In some embodiments, the processing problem occurred after processing the child process, but before the parent DPU received results of the child process.

Depending on the status of the child process, the parent DPU may decide to allow the child process to continue running at the child process (e.g., in the case where the instructions are still valid and able to be executed at the child DPU). In some embodiments, the parent DPU may be able to retrieve and/or receive the results of the child process (e.g., in the case where the process has completed and the corresponding data is stored in non-volatile memory). In some embodiments, the parent DPU may restart the child process at the child DPU, (e.g., by re-sending instructions corresponding to the child process), as represented by event 7A. In some embodiments, the parent DPU may restart the child process at a DPU other than the child DPU, of an associated network of data processing units, as represented by event 7B. In some embodiments, if the first DPU restarts the child process at a DPU other than the child DPU, the first DPU transmits a notice of this re-assignment to the child DPU. The child DPU may use this re-assignment notice to remove any instructions and/or completed process data corresponding to the child process from its management unit and/or non-volatile memory.

Figure 19:
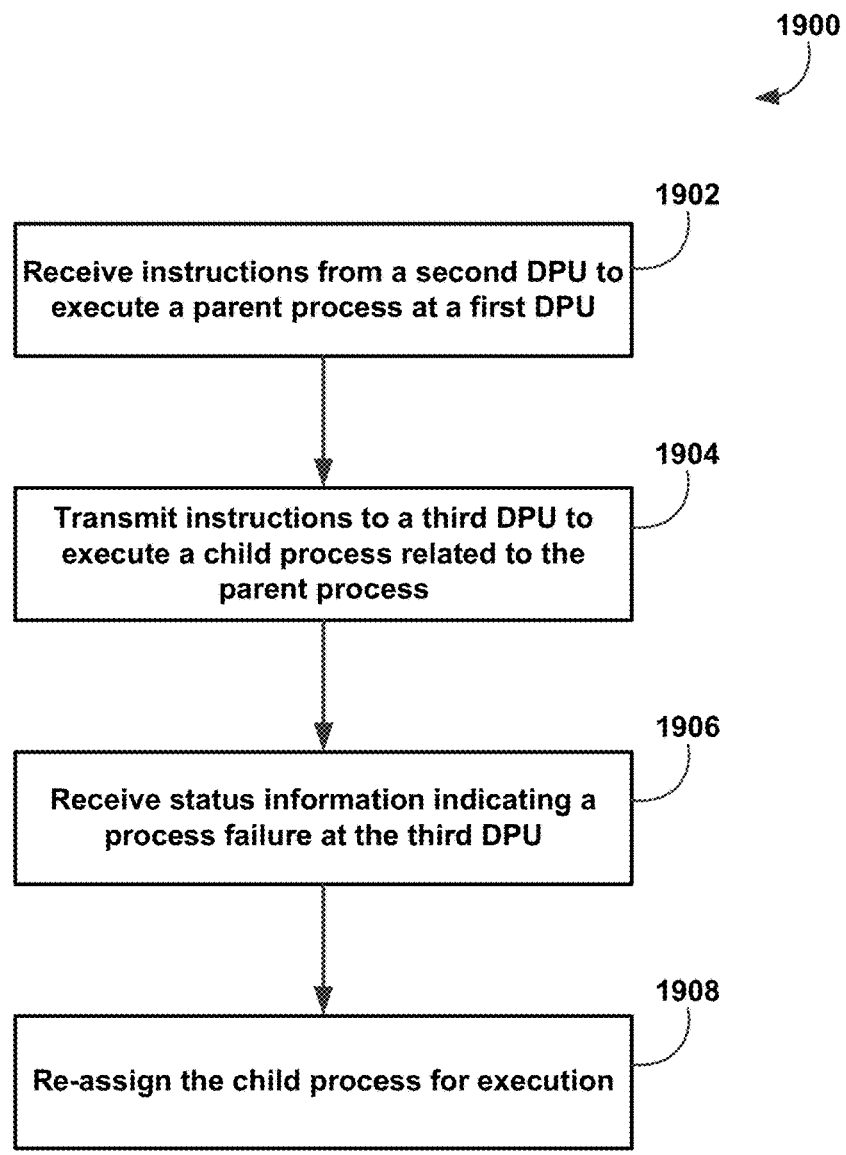
FIG. 19 is a flow diagram illustrating a method of responding to a failure to execute a child process according to one or more embodiments.

FIG. 19 is a flow diagram illustrating a method 1900 of responding to a failure to execute a child process according to one or more embodiments. In some embodiments, a first DPU (e.g., the parent DPU of FIG. 18), receives instructions to execute a parent process from a second DPU (e.g., the grandparent DPU of FIG. 18), as represented by block 1902. The first DPU may then transmit instructions to execute a child process associated with the parent process to a third DPU (e.g., the child DPU of FIG. 18), as represented by block 1904. Method 1900 may further include the first DPU receiving status information pertaining to the child process indicating a process failure at the third DPU, as represented by block 1906 and re-assigning the child process for execution, as represented by block 1908. In some embodiments the child process is re-assigned to the third DPU, while in some embodiments the child process is re-assigned to a DPU other than the third DPU.

Figure 20:
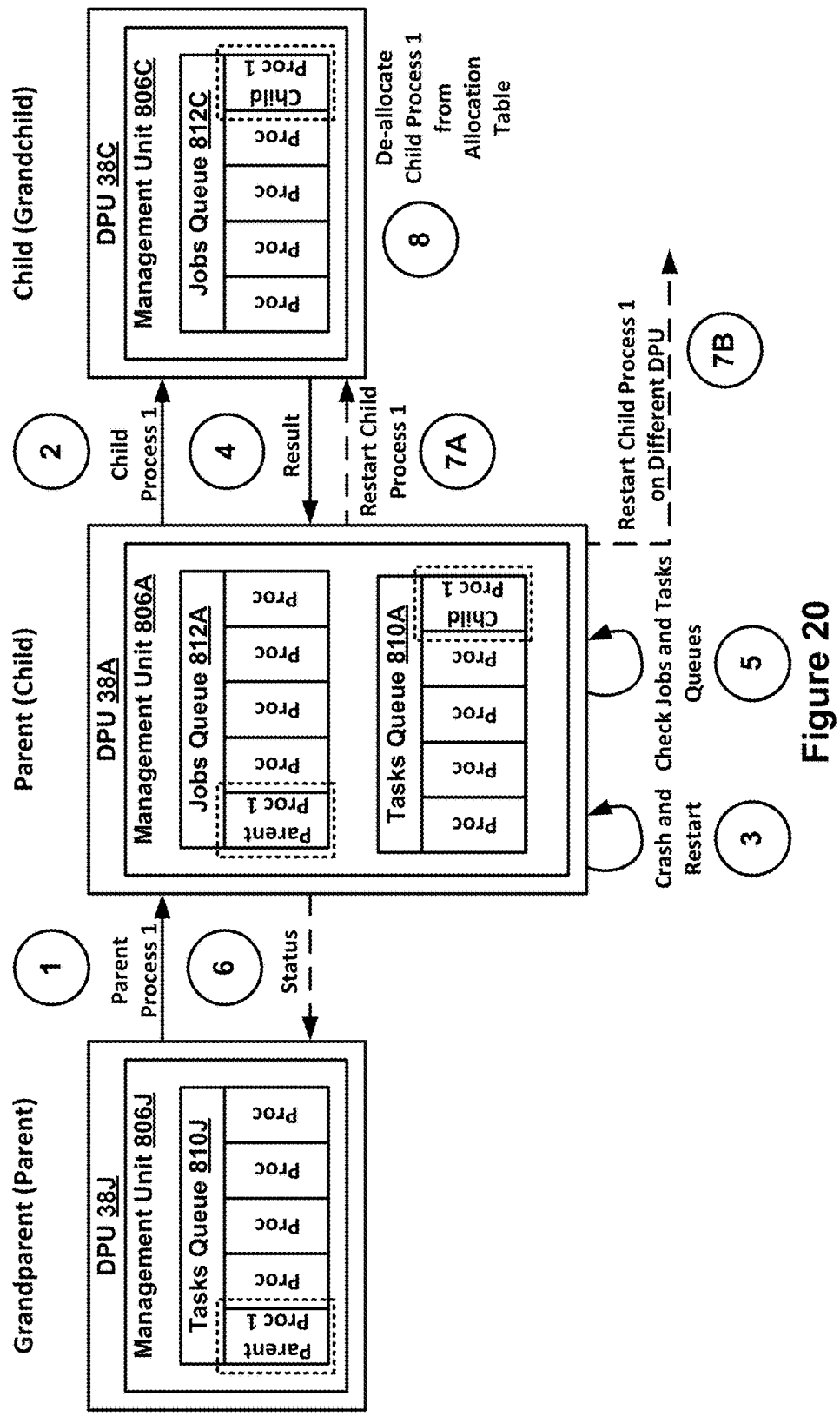
FIG. 20 is a block diagram illustrating a method of responding to a DPU restart event according to one or more embodiments.

FIG. 20 is a block diagram illustrating a method of responding to a DPU restart event according to one or more embodiments. As explained above with respect to FIGS. 18 and 19, instructions to perform Parent Process 1 are received at the parent DPU (DPU 38A) from the grandparent DPU (DPU 38J), as represented by event 1. The instructions to perform Parent Process 1 are placed in NVM memory at DPU 38A and a process descriptor corresponding to Parent Process 1 in the jobs queue 812A at DPU 38A. In some embodiments, instructions to perform at least one corresponding child process, Child Process 1 are determined to be required to be generated. Instructions for Child Process 1 are generated and a corresponding process descriptor placed in tasks queue 810A, and assigned to a child DPU (DPU 38C). Instructions for Child Process 1 are sent to the child DPU, as represented by event 2. However, as described above with respect to FIG. 17, in some embodiments, executable code, data, and/or instructions corresponding to a process may already be present (e.g., stored in NVM memory) at an assigned DPU.

In some embodiments, the parent DPU experiences a problem with executing the assigned parent process (e.g., Parent Process 1). In this example, the parent DPU, DPU 38A experiences a system-wide crash and subsequent restart, as represented by event 3. In some embodiments, a system-wide crash results in an emptying of the contents of the jobs queue 812A and/or of the tasks queue 810A of the parent DPU, including the process descriptor corresponding to the assigned parent process. In some embodiments, a system-wide crash does not result in an emptying of the contents of the jobs queue 812A of the parent DPU, including the process descriptor corresponding to the assigned parent process. Nonetheless, after restarting (or otherwise resolving the processing issue), the parent DPU checks its jobs queue 812A and tasks queue 810A, as represented by event 5. The first DPU may check its jobs queue and tasks queue for validity and/or to determine the current state of respective processes in each queue. For example, if the tasks queue is intact, the first DPU may be able to access process descriptors corresponding to assigned processes in the tasks queue and send status request messages to DPUs corresponding to the process descriptors.

In some embodiments, the child DPU completes processing of the child process and transmits results of the child process to the parent DPU, as represented here by event 4. In some embodiments, the results of the child process are received at the parent DPU before the processing issue occurs, yet also before the parent DPU can complete processing of the associated parent process (Parent Process 1). In some embodiments, the results of the child process are received at the parent DPU while the processing issue is occurring (e.g., while DPU 38A is offline or in an unresponsive state). In some embodiments, the results of the child process are received at the parent DPU after the parent DPU has resolved the processing issue (e.g., after restarting). Therefore, while the example of FIG. 20 shows the result of the child process being received at the first DPU after restarting the first DPU, one of ordinary skill in the art will understand that the relative order of this event may not be as shown.

In some embodiments, the first DPU, which experienced the processing issue, transmits a status message to the second DPU, as represented by event 6. In some embodiments, this status message is transmitted in response to resolving the processing issue (e.g., restarting the first DPU), performing a check on the jobs queue and/or receiving a request for status on execution of the assigned parent process (e.g., Parent Process 1). In some embodiments, this status is transmitted before restarting the child process (e.g., Child Process 1), as shown in FIG. 20. However, it will be understood by one skilled in the art that the status may be optionally transmitted to the grandparent DPU, and/or transmitted after restarting the child process.

In some embodiments, the first DPU restarts the child process at the third DPU again, as represented by event 7A. Alternatively, the first DPU may restart the child process at a DPU other than the third DPU, as represented by event 7B. The first DPU may re-assign the child process to a DPU other than the third DPU (e.g., a fourth data processing unit) on the basis of one or more re-assignment criteria. For example, the fourth DPU may have a relatively small number of processes in its jobs queue, it may have a low processing load or it may host data involved in the processing of the re-assigned child process.

As explained above, in some embodiments, the completed results of the child process are stored in non-volatile memory at the third DPU because the child process successfully completed. However, in some embodiments, the third DPU may have de-allocated the memory storage designated for the results of the child process from its allocation table, as represented by event 8 (e.g., by removing a process descriptor from its allocation table). The child DPU may have de-allocated the completed child process in response to receiving a re-assignment message from the first DPU, indicating that the child process has been restarted at a DPU other than the child DPU. In some embodiments, in a system of interconnected DPUs, a child DPU awaits a process completion acknowledgment message from the parent DPU receiving the results of the child process. In the absence of receipt of the process completion acknowledgment message after a predefined period of time, the child DPU de-allocates the memory storage designated for the results of the child process from its allocation table.

Figure 21:
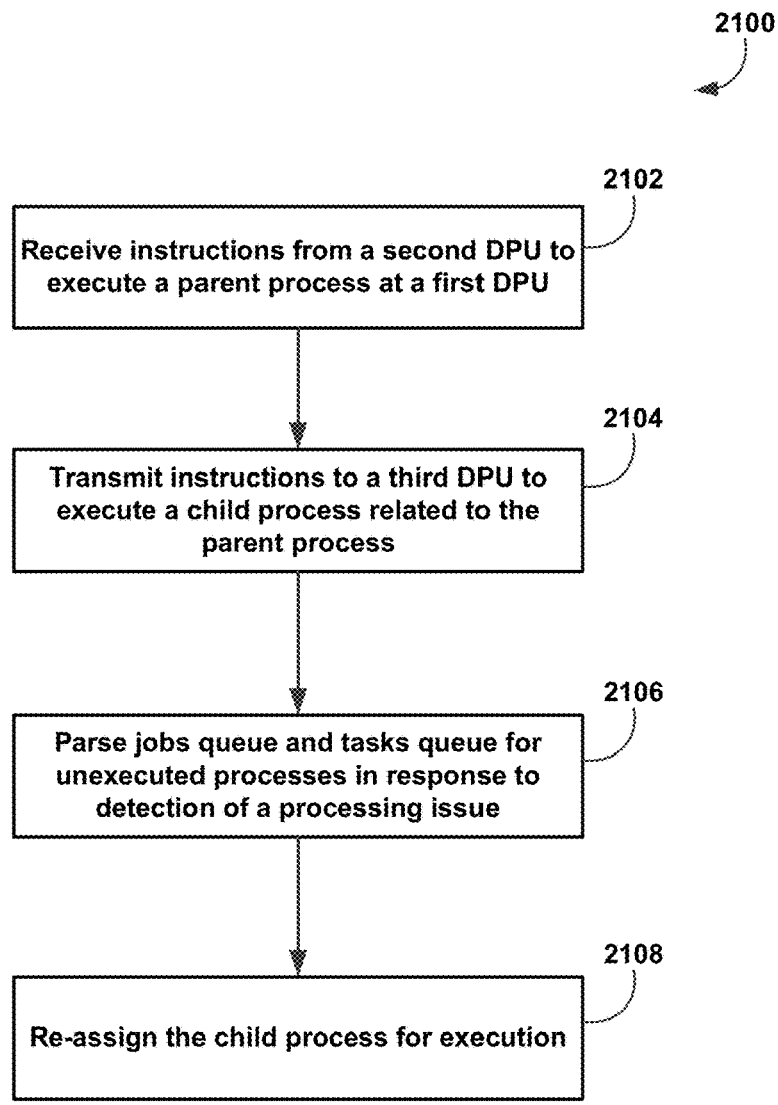
FIG. 21 is a flow diagram illustrating a method of responding to a DPU restart event according to one or more embodiments.

FIG. 21 is a flow diagram illustrating a method 2100 of responding to a DPU restart event according to one or more embodiments. As shown in FIG. 21, a first DPU may receive instructions from a second DPU to execute a parent process, as represented by block 2102. The method 2100 may further include the first DPU transmitting instructions to execute a child process associated with the parent process to a third DPU, as represented by block 2104. For example, the child process is derived from the parent process and/or includes some of the executable code of the parent process. In some embodiments, the first DPU experiences a processing issue after transmitting the instructions for executing the child process. The first DPU may parse a jobs queue at the first DPU for unexecuted processes in response to detection of an occurrence of a processing issue at the first data processing unit, and/or parse a tasks queue at the first data processing unit for unexecuted processes in response to detection of an occurrence of a processing issue at the first data processing unit, as represented by block 2106. In some embodiments, parsing the jobs queue and/or tasks queue is performed in response to detecting execution of a recovery operation with respect to the processing issue (e.g., detecting restarting of the first DPU). The method may include the first DPU re-assigning the child process for execution, as represented by block 2108.

Figure 22:
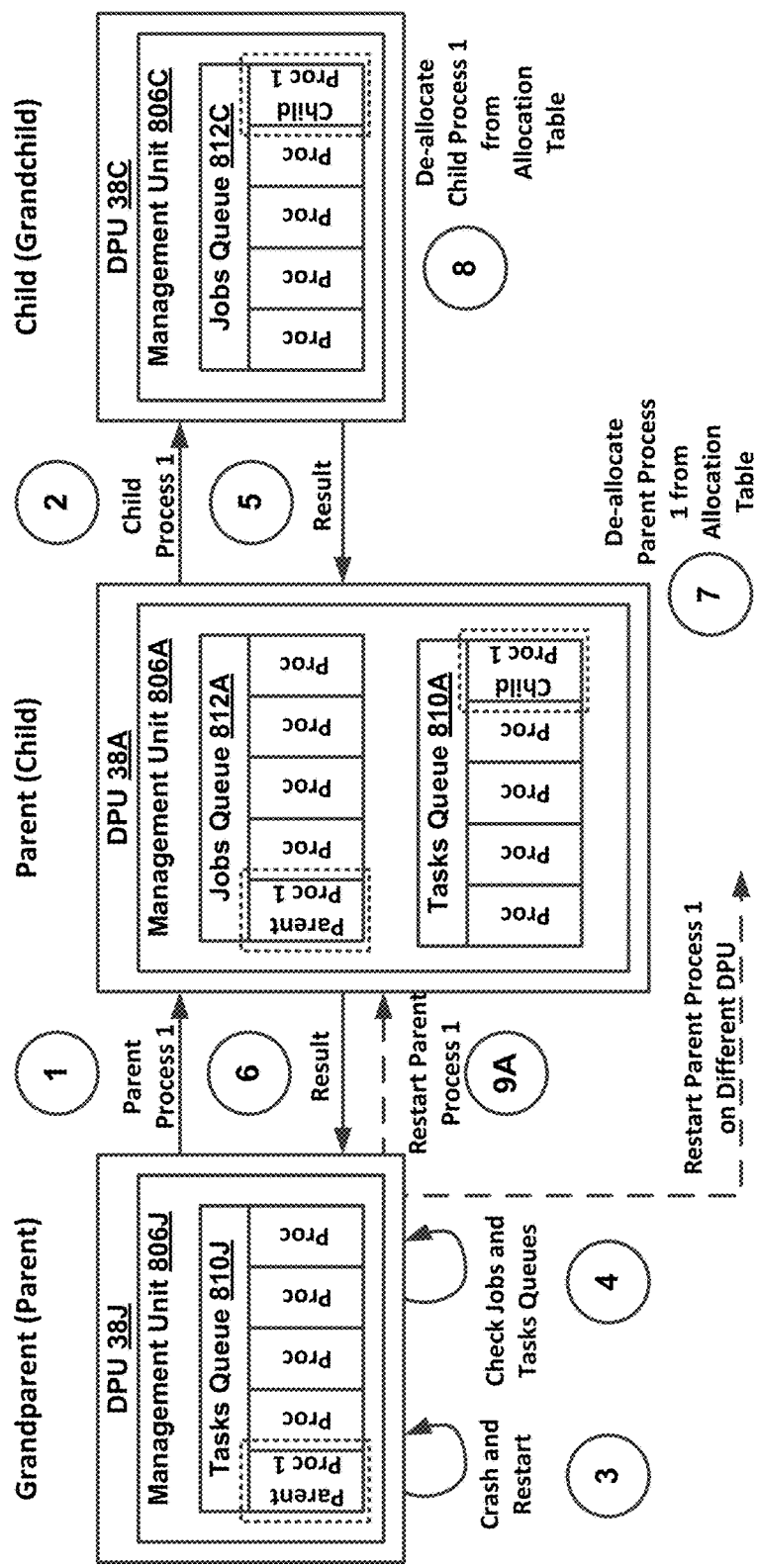
FIG. 22 is a block diagram illustrating a method of responding to a parent process DPU restart event according to one or more embodiments.

FIG. 22 is a block diagram illustrating a method of responding to a parent process DPU restart event according to one or more embodiments. As described above with respect to FIGS. 18-21, a first DPU receives instructions to execute a parent process, as represented by event 1, and transmits instructions to perform a corresponding child process, as represented by event 2. In this example, the grandparent DPU experiences a processing issue (e.g., a system-wide crash), and a subsequent recovery from the processing issue (e.g., DPU restart), as represented by event 3. In this example, as the grandparent DPU, DPU 38J, is recovering from the processing issue, it may parse and/or check its jobs queue and/or tasks queue 810J for validity, as represented by event 4.

In some embodiments, before, during or after occurrence of this processing issue at the grandparent DPU, the child process has been completed and the results of the completed child process (and/or notice of the completion) are received by the first DPU, as represented by event 5. Additionally, the first DPU uses the results of the child process to complete execution of the parent process and transmits the results of the parent process to the grandparent DPU, as represented by event 6. In some embodiments, the results of the parent process are transmitted to the grandparent DPU before the grandparent DPU can acknowledge a need for the results, and/or completion of a process requiring those results.

As explained above, in some embodiments, the completed results of the parent process are stored in non-volatile memory at the first DPU because the parent process successfully completed. However, in some embodiments, the first DPU may have de-allocated the memory storage designated for the results of the child process (e.g., by removing a corresponding process descriptor from its allocation table), as represented by event 7. The parent DPU may have de-allocated the completed parent process in response to receiving a re-assignment message from the second DPU, indicating that the parent process has been restarted at a DPU other than the parent DPU. In some embodiments, in a system of interconnected DPUs, a parent DPU awaits a process completion acknowledgment message from the grandparent DPU receiving the results of the parent process. In the absence of receipt of the process completion acknowledgment message after a predefined period of time, the parent DPU de-allocates the memory storage designated for the results of the parent process from its allocation table.

Similarly, in some embodiments, the completed results of the child process are stored in non-volatile memory at the third DPU because the child process successfully completed. However, in some embodiments, the third DPU may have de-allocated the memory storage designated for the results of the child process from its allocation table, as represented by event 8. The child DPU may have de-allocated the memory corresponding to the completed child process (e.g., executable code, data and/or results) in response to receiving a re-assignment message from the first DPU, indicating that the child process has been restarted at a DPU other than the child DPU. In some embodiments, in a system of interconnected DPUs, a child DPU awaits a process completion acknowledgment message from the parent DPU receiving the results of the child process. In the absence of receipt of the process completion acknowledgment message after a predefined period of time, the child DPU de-allocates the memory storage designated for the results of the child process from its allocation table.

FIG. 22 further illustrates that in some embodiments, the grandparent DPU may restart the parent process either by sending instructions to restart the parent process at the first DPU again, as represented by event 9A, or by sending instructions to restart the parent process at a DPU other than the first DPU, as represented by event 9B. The grandparent DPU may re-assign the parent process to a DPU other than the first DPU (e.g., a fourth data processing unit) on the basis of one or more re-assignment criteria. For example, the fourth DPU may have a relatively small number of processes in its jobs queue, it may have a low processing load or it may host data involved in the processing of the re-assigned parent process.

Figure 23:
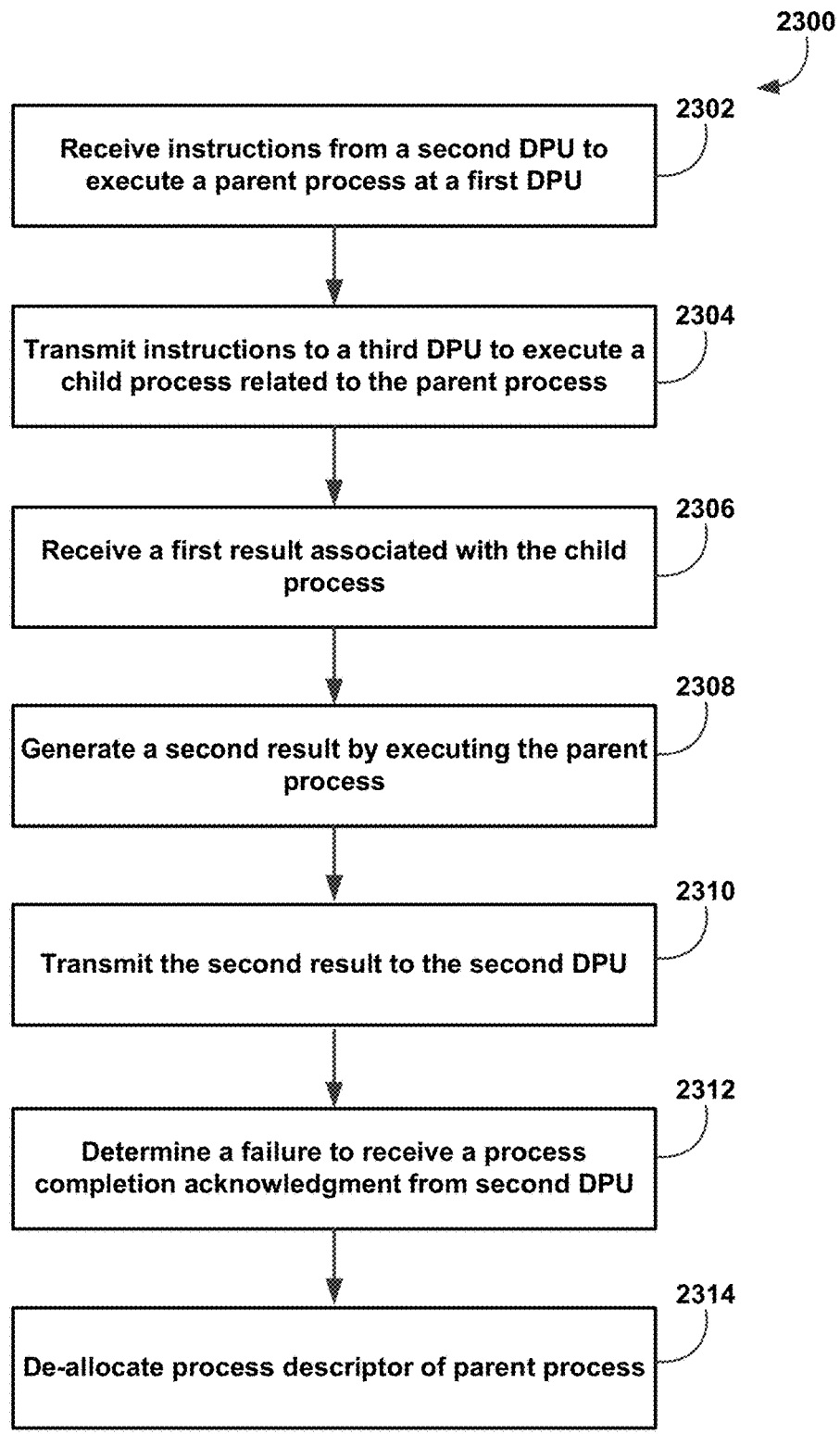
FIG. 23 is a flow diagram illustrating a method of responding to a parent process DPU restart event according to one or more embodiments.

FIG. 23 is a flow diagram illustrating a method 2300 of responding to a parent process DPU restart event according to one or more embodiments. In some embodiments, a first DPU receives instructions to execute a parent process from a second DPU, as represented by block 2302. Furthermore, the first DPU may transmit instructions to execute a child process associated with the parent process to a third DPU, as represented by block 2304. The method may include the first DPU receiving a first result associated with the child process from the third DPU, as represented by block 2306. For example, as shown in FIG. 22, DPU 38A received the results of Child Process 1 from DPU 38C. The first DPU may also generate a second result by executing the parent process, as represented by block 2308, and transmit the second result to the second DPU, as represented by block 2310. In some embodiments, the second result is generated by using the first result of the completed child process. In some embodiments, the completed first result is retrieved from non-volatile memory of the third DPU.

Method 2300 may additionally include the first DPU determining a failure to receive a process completion acknowledgment from the second DPU, as represented by block 2312. Alternatively, in some embodiments, the first DPU may receive a process re-assignment message or a status message or another indication from the second DPU that the completed process data corresponding to the parent process is no longer needed. The first DPU may de-allocate memory (e.g., deleting a process descriptor) corresponding to the parent process in an allocation table at the first DPU in response to determining the failure to receive the process completion acknowledgment, as represented by block 2314. Alternatively, in some embodiments, the first DPU may de-allocate memory (e.g., deleting a process descriptor) corresponding to the parent process in an allocation table at the first DPU in response to receiving a process re-assignment message or a status message or another indication from the second DPU that the completed process data corresponding to the parent process is no longer needed.

Figure 24:
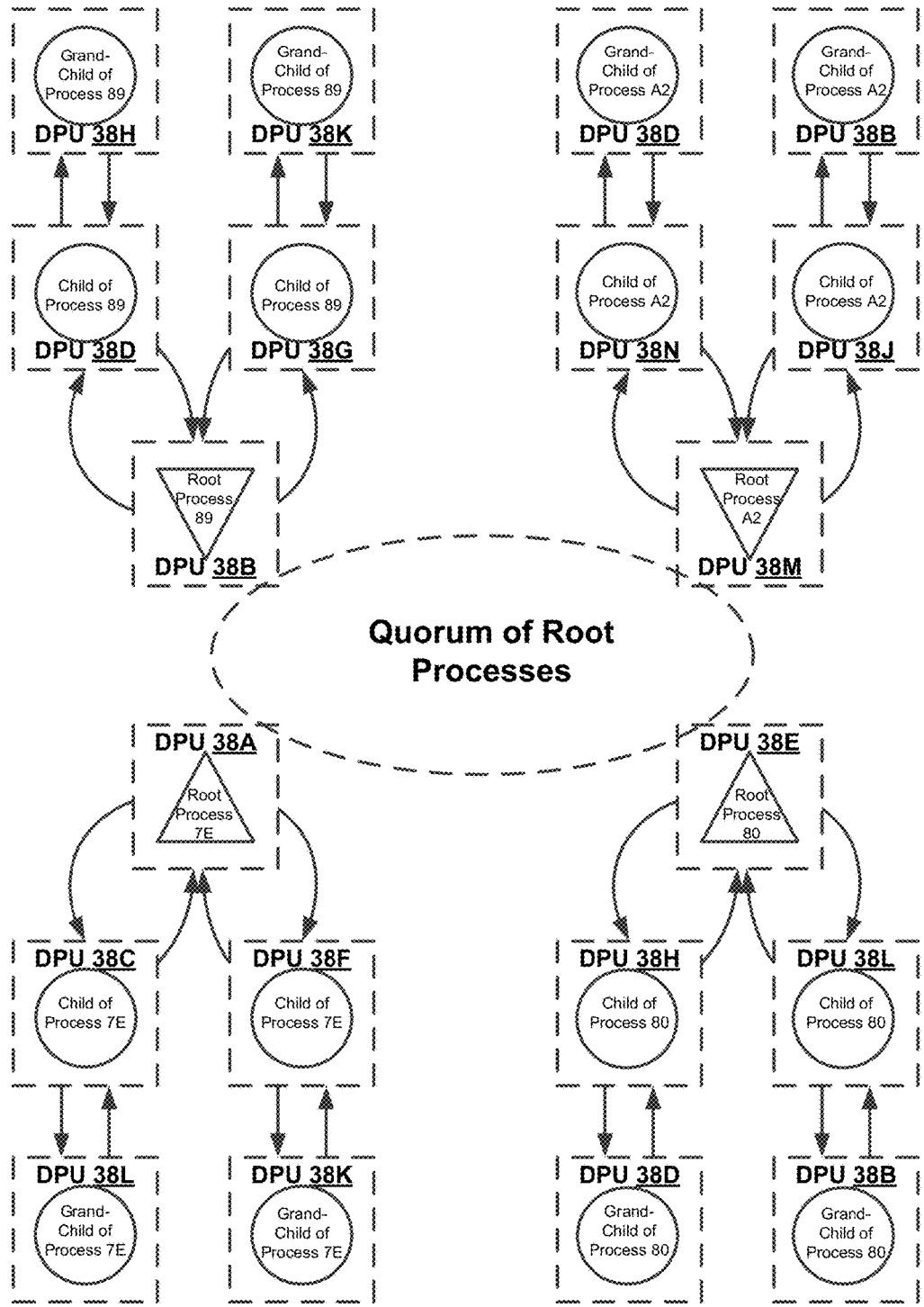
FIG. 24 is a block diagram of an example hierarchy of a quorum of root processes amongst data processing units according to one or more embodiments.

FIG. 24 is a block diagram of an example hierarchy of a quorum of root processes amongst data processing units according to one or more embodiments. In some embodiments, a computing system, such as the one described with respect to FIG. 1, includes a plurality of interconnected data processing units working in tandem to support a number of root processes (e.g., of an operating system). Each root process may be executed at a different DPU of the plurality of interconnected DPUs. For example, as shown in FIG. 24, root process 89 is executed at DPU 38B, root process A2 is executed at DPU 38M, root process 7E is executed at DPU 38A and root process 80 is executed at DPU 38E. In some embodiments, the child processes of the root processes of the quorum of root processes are assigned to as diverse a set of data processing units as possible. For example, as shown in FIG. 24, none of the child processes of the example root processes are assigned and executed at the same DPU. In some embodiments, this technique of spreading out and diversifying subsequent generations of processes is performed as best as possible, given the number of processes of each generation and the number of distinct data processing units in the plurality of data processing units available for execution of processes.

Figure 25:
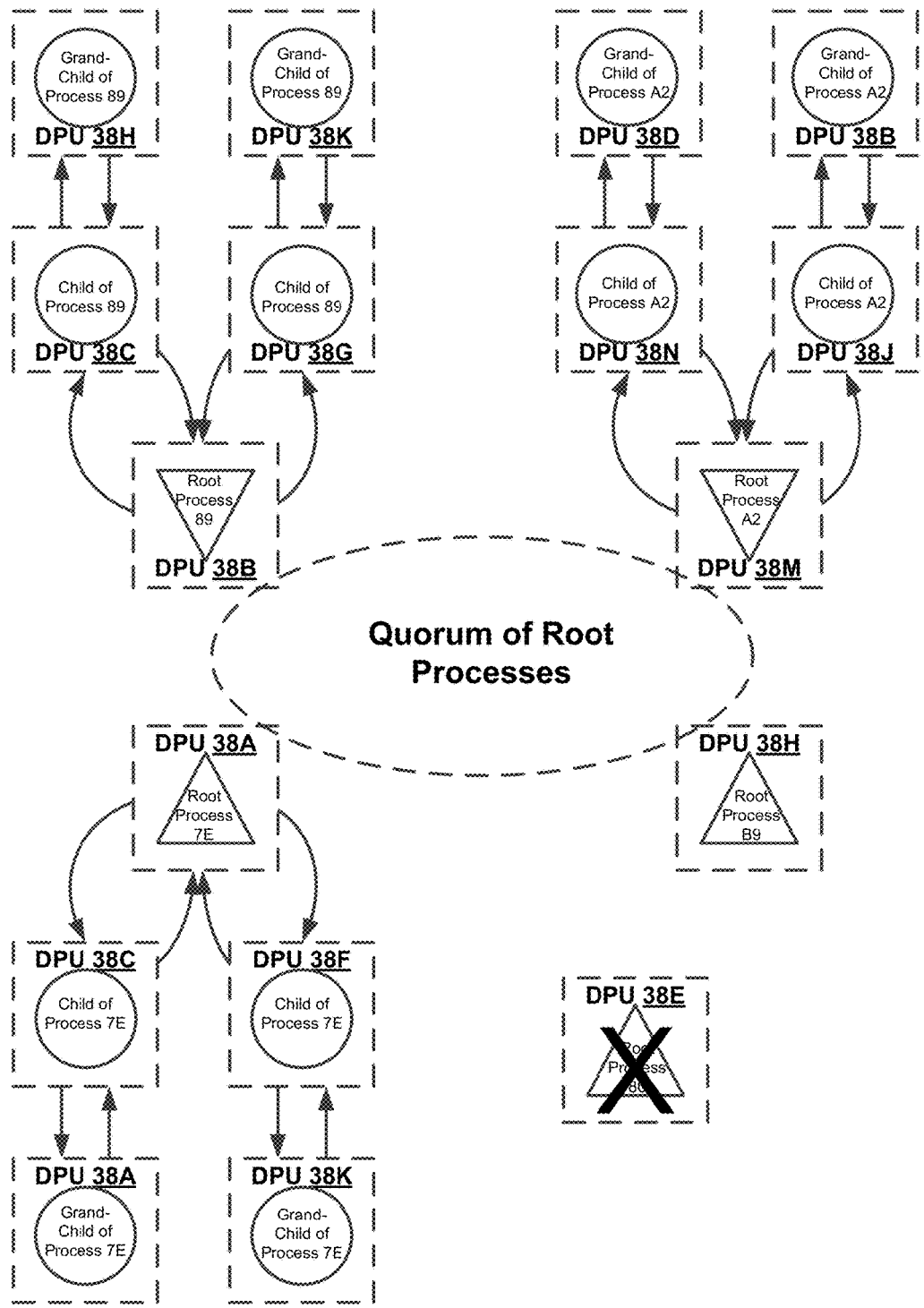
FIG. 25 is a block diagram illustrating a method of maintaining a quorum of root processes amongst data processing units according to one or more embodiments.

FIG. 25 is a block diagram illustrating a method of maintaining a quorum of root processes amongst data processing units according to one or more embodiments. In some embodiments, one or more data processing units of the plurality perform a periodic check on the status of a quorum of root processes. For example, a first DPU may check to make sure that at a system level there is at least a minimum number of root processes in simultaneous operation. In the event that a data processing unit executing a root process experiences a processing issue (e.g., a crash, goes offline, runs out of processing resources and/or becomes unresponsive), a new root process is assigned to a data processing unit distinct from the other data processing units executing a root process, and distinct from the failed data processing unit that experienced the processing issue. For example, DPU 38E was executing root process 80 when it experienced a processing issue causing a failure to execute root process 80 anymore. Another root process, root process B9, is shown to be assigned to DPU 38H for execution. In some embodiments, any DPU of the plurality of DPUs may generate instructions to assign execution of the new root process, while in some embodiments, only one of the DPUs currently executing a root process may generate instructions and/or assign execution of the new root process.

Figure 26:
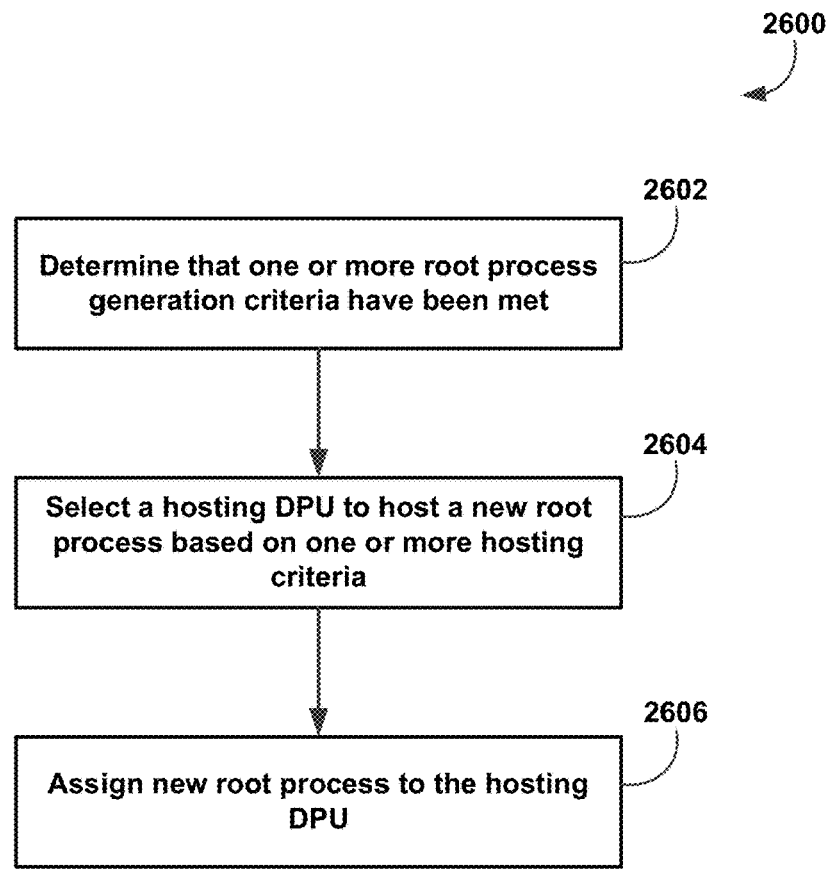
FIG. 26 is a flow diagram illustrating a method of maintaining a quorum of root processes according to one or more embodiments.

FIG. 26 is a flow diagram illustrating a method 2600 of maintaining a quorum of root processes according to one or more embodiments. Method 2600 starts with a first DPU determining that one or more root process generation criteria have been satisfied, as represented by block 2602. For example, root process generation criteria may include the number of currently executing root processes falling below a threshold number, the duration of time since the last root process was launched exceeding a threshold duration of time, and/or a measure of processing resources falling below a threshold value at one or more DPUs currently executing a root process. Processing resources could include storage and/or processing capabilities for continued execution of root processes. In some embodiments, method 2600 includes a first DPU selecting a hosting DPU to host a new root process based on one or more hosting criteria, as represented by block 2604. The first DPU may assign a new root process to the hosting data processing unit, as represented by block 2606. In some embodiments, a first hosting criterion is satisfied in accordance with a determination that the selected hosting DPU has less than a predefined load level.

Additional Embodiments

Those skilled in the art will appreciate that in some embodiments, other types of systems, devices, and/or apparatuses can be implemented while remaining within the scope of the present disclosure. In addition, the actual steps taken in the processes discussed herein may differ from those described or shown in the figures. Depending on the embodiment, certain of the steps described above may be removed, others may be added.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A computing system comprising a device, the device comprising:
    a non-volatile memory divided into a plurality of memory sub-arrays, each memory sub-array comprising a plurality of selectable locations; and
    a plurality of data processing units communicatively coupled to the non-volatile memory in the absence of a central processing unit of the computing system, including a data processing unit assigned to process data of a memory sub-array, the data processing unit configured to:
        determine validity of an allocation table of the data processing unit;
        retrieve a first process descriptor from the allocation table;
        parse the non-volatile memory for a first set of process data corresponding to the first process descriptor;
        determine validity of the first set of process data corresponding to the first process descriptor; and
        attempt to recover the first set of process data in accordance with a determination that the first set of process data is invalid.

2. The computing system of claim 1, wherein validity of the allocation table is determined at least in part on a correspondence of contents of the allocation table to a checksum value assigned to the allocation table.

3. The computing system of claim 1, wherein validity of the first set of process data is determined at least in part on a correspondence of contents of the first set of process data to a checksum value assigned to the first set of process data.

4. The computing system of claim 1, wherein the data processing unit is further configured to retrieve the first process descriptor from the allocation table in accordance with a determination that the allocation table is valid.

5. The computing system of claim 1, wherein the first set of process data comprises code data and user data.

6. The computing system of claim 1, wherein the data processing unit is further configured to:
 determine a failure to recover the first set of process data; and
 remove the first process descriptor corresponding to the first set of process data from the allocation table, in accordance with a determination that the first set of process data cannot be recovered.

7. The computing system of claim 1, wherein the data processing unit is further configured to:
 determine invalidity of at least a part of the allocation table; and
 create a new allocation table in accordance with a determination that the allocation table is invalid.

8. The computing system of claim 7, wherein the data processing unit is further configured to:
 parse the non-volatile memory for process signatures;
 detect a process signature corresponding to a second set of process data; and
 determine validity of the second set of process data.

9. The computing system of claim 8, wherein the data processing unit is further configured to:
 add a second process descriptor corresponding to the second set of process data to the new allocation table in accordance with a determination that the second set of process data is valid.

10. The computing system of claim 8, wherein the data processing unit is further configured to:
 attempt to recover the second set of process data in accordance with a determination that the second set of process data is invalid; and
 add a second process descriptor corresponding to a recovered second set of process data to the new allocation table in accordance with a determination that the second set of process data has been recovered.

11. A data processing unit (DPU) of a plurality of DPUs of a computing system without a central processing unit and each DPU communicatively coupled to a non-volatile memory, the DPU configured to:
 determine validity of an allocation table of the data processing unit;
 retrieve a first process descriptor from the allocation table;
 parse the non-volatile memory for a first set of process data corresponding to the first process descriptor;
 determine validity of the first set of process data corresponding to the first process descriptor; and
 attempt to recover the first set of process data in accordance with a determination that the first set of process data is invalid.

12. The DPU of claim 11, wherein validity of the allocation table is determined at least in part on a correspondence of contents of the allocation table to a checksum value assigned to the allocation table.

13. The DPU of claim 11, wherein validity of the first set of process data is determined at least in part on a correspondence of contents of the first set of process data to a checksum value assigned to the first set of process data.

14. The DPU of claim 11, further configured to retrieve the first process descriptor from the allocation table in accordance with a determination that the allocation table is valid.

15. The DPU of claim 11, wherein the first set of process data comprises code data and user data.

16. The DPU of claim 11, further configured to:
 determine a failure to recover the first set of process data; and
 remove a process descriptor corresponding to the first set of process data from the allocation table, in accordance with a determination that the first set of process data cannot be recovered.

17. The DPU of claim 11, further configured to:
 determine invalidity of at least a part of the allocation table; and
 create a new allocation table in accordance with a determination that the allocation table is invalid.

18. The DPU of claim 17, further configured to:
 parse the non-volatile memory for process signatures;
 detect a process signature corresponding to a second set of process data; and
 determine validity of the second set of process data.

19. The DPU of claim 18, further configured to:
 add a second process descriptor corresponding to the second set of process data to the new allocation table in accordance with a determination that the second set of process data is valid.

20. The DPU of claim 18, further configured to:
 attempt to recover the second set of process data in accordance with a determination that the second set of process data is invalid; and
 add a second process descriptor corresponding to a recovered second set of process data to the new allocation table in accordance with a determination that the second set of process data has been recovered.

21. A method of maintaining allocation table data of a data processing unit (DPU) of a plurality of DPUs of a computing system without a central processing unit and each DPU communicatively coupled to a non-volatile memory, the method at the DPU comprising:
 determining validity of an allocation table of the DPU;
 retrieving a first process descriptor from the allocation table;
 parsing the non-volatile memory for a first set of process data corresponding to the first process descriptor;
 determining validity of the first set of process data corresponding to the first process descriptor; and
 initiating recovery of the first set of process data in accordance with a determination that the first set of process data is invalid.

22. The method of claim 21, further comprising:
 determining validity of the allocation table at least in part on a correspondence of contents of the allocation table to a checksum value assigned to the allocation table.

23. The method of claim 21, further comprising:
 retrieving the first process descriptor from the allocation table in accordance with a determination that the allocation table is valid.

24. The method of claim 21, further comprising:
 determining a failure to recover the first set of process data; and
 removing the first process descriptor corresponding to the first set of process data from the allocation table, in accordance with a determination that the first set of process data cannot be recovered.

25. The method of claim 21, further comprising:
 determining invalidity of at least a part of the allocation table; and
 creating a new allocation table in accordance with a determination that the allocation table is invalid.

26. The method of claim 25, further comprising:
parsing the non-volatile memory for process signatures;
detecting a process signature corresponding to a second set of process data; and
determining validity of the second set of process data.

27. The method of claim 26, further comprising:
adding a second process descriptor corresponding to the second set of process data to the new allocation table in accordance with a determination that the second set of process data is valid.

28. The method of claim 26, further comprising:
attempting to recover the second set of process data in accordance with a determination that the second set of process data is invalid; and
adding a second process descriptor corresponding to a recovered second set of process data to the new allocation table in accordance with a determination that the second set of process data has been recovered.

* * * * *